United States Patent [19]
Witek et al.

[11] Patent Number: 5,627,395
[45] Date of Patent: May 6, 1997

[54] VERTICAL TRANSISTOR STRUCTURE

[75] Inventors: Keith E. Witek; Jon T. Fitch; Carlos A. Mazuré, all of Austin, Tex.

[73] Assignee: Motorola Inc., Schaumburg, Ill.

[21] Appl. No.: 552,180

[22] Filed: Nov. 2, 1995

Related U.S. Application Data

[62] Division of Ser. No. 316,754, Oct. 3, 1994, Pat. No. 5,527,723, which is a division of Ser. No. 215,888, Mar. 15, 1994, Pat. No. 5,393,681, which is a division of Ser. No. 940,026, Sep. 2, 1992, Pat. No. 5,272,257.

[51] Int. Cl.⁶ ............... H01L 27/01; H01L 27/12; H01L 31/0392
[52] U.S. Cl. ............... 257/350; 257/347; 257/348; 257/351; 257/352
[58] Field of Search ............... 257/370, 330, 257/263, 264, 270, 278, 242, 273, 302, 350, 347, 348, 351, 352, 353, 401

[56] References Cited

U.S. PATENT DOCUMENTS

| | | | |
|---|---|---|---|
| 4,317,275 | 3/1982 | Dozier | 29/571 |
| 4,498,226 | 2/1985 | Inoue et al. | 29/576 |
| 4,503,451 | 3/1985 | Lund et al. | 357/50 |
| 4,530,149 | 7/1985 | Jastrzebski et al. | 29/571 |
| 4,536,782 | 8/1985 | Brown | 257/352 |
| 4,541,167 | 9/1985 | Havemann et al. | 29/576 W |
| 4,663,831 | 5/1987 | Birrittella et al. | 29/576 |
| 4,714,685 | 12/1987 | Schubert | 437/41 |
| 4,716,128 | 12/1987 | Schubert et al. | 437/41 |
| 4,729,006 | 3/1988 | Dally et al. | 357/42 |
| 4,757,029 | 7/1988 | Koury, Jr. | 437/90 |
| 4,763,181 | 8/1988 | Tasch, Jr. | 257/22 |
| 4,772,568 | 9/1988 | Jastrzebski | 437/34 |
| 4,786,615 | 11/1988 | Liaw et al. | 437/89 |
| 4,829,016 | 5/1989 | Neudeck | 437/31 |
| 4,835,586 | 5/1989 | Cogan et al. | 257/22 |
| 4,849,371 | 7/1989 | Hansen et al. | 437/82 |
| 4,902,641 | 2/1990 | Koury, Jr. | 437/62 |
| 5,031,020 | 7/1991 | Momose | 257/370 |
| 5,057,455 | 10/1991 | Foo et al. | 437/193 |
| 5,079,183 | 1/1992 | Maeda et al. | 437/64 |
| 5,106,778 | 4/1992 | Hollis et al. | 437/90 |
| 5,198,375 | 3/1993 | Hayden et al. | 437/31 |
| 5,208,172 | 5/1993 | Fitch et al. | 437/40 |
| 5,215,931 | 6/1993 | Houston | 437/40 |
| 5,252,143 | 10/1993 | Chiang et al. | 148/33 |
| 5,281,837 | 1/1994 | Kohyama | 257/296 |
| 5,489,790 | 2/1996 | Lage | 257/351 |

OTHER PUBLICATIONS

"Three Dimensional Devices Fabricated by Silicon Epitaxial Lateral Overgrowth," by Neudeck et al., published in Journal of Electronic Materials, vol. 19, No. 10, 1990, pp. 1111–1117.

"Interface Characterization of Silicon Epitaxial Lateral Overgrowth over Existing sio2 for Three–Dimensional Structures," Friedrich et al., IEEE Elect Dev Ltrs, vol. 10, No. 4, Apr. 89, pp. 144–146.

"Fabrication of CMOS on Ultrathin SOI Obtained by Epitaxial Lateral Overgrowth and Chemical–Mechanical Polishing," by Shahidi et al., published via 1990 IEEE IEDM, pp. 587–590.

(List continued on next page.)

Primary Examiner—Sara W. Crane
Assistant Examiner—Fetsum Abraham
Attorney, Agent, or Firm—Keith E. Witek

[57] ABSTRACT

A vertically raised transistor (10) is formed having a substrate (12). A conductive plug region (22) is selectively or epitaxially formed to vertically elevate the transistor (10). A first doped region (16a) and a second doped region (16b) are each electrically coupled to the conductive plug region (22) via sidewall contacts. The doped regions (16a and 16b) are used to form current electrode regions (26) within the conductive plug region (22). A channel region separates the current electrodes (26). A gate dielectric layer (28) is formed to overlie the channel region. A conductive layer (30) is formed to overlie the gate dielectric layer (28). Conductive layer (30) forms a gate electrode for the transistor (10). The vertical raised transistor (10) and conductive plug region (22) provide improved device isolation and improved device operation.

20 Claims, 14 Drawing Sheets

OTHER PUBLICATIONS

"A Fully Depleted Lean–Channel Transistor (DELTA)—A Novel Vertical Ultrathin SOI MOSFET," by Hisamoto et al., published in IEEE Electron Device Letters, vol. 11, No. 1, Jan. 1990, pp. 36–38.

"Advanced Dielectric Isolation Through Selective Epitaxial Growth Techniques," by Borland et al., published in Solid State Technology, Aug. 1985, pp. 141–148.

"Scaled CMOS Technology Using SEG Isolation and Buried Well Process," by Endo et al., published in IEEE Transactions on Electron Devices, vol. ED–33, No. 11, Aug. 1988, pp. 1382–1383.

Selective Epitaxial Growth for the Fabrication of CMOS Integrated Circuits, by Ipri et al., published in IEEE Trans. on Electron Devices, vol. ED–31, No. 12, Dec. 1984, pp. 1741–1748.

MONO/POLY Technology for Fabricating Low–Capacitance CMOS Integrated Circuits, by Ipri et al., published in IEEE Trans. on Electron Devices, vol. 35, No. 8, Dec. 1984, pp. 1741–1748.

VERTICAL TRANSISTOR STRUCTURE

This is a divisional of application Ser. No. 08/316,754 filed on Oct. 3,1994, now U.S. Pat. No. 5,527,723 which is a divisional of application Ser. No. 08/215,888 filed on Mar. 15, 1994, now U.S. Pat. No. 5,393,681 which is a divisional of application Ser. No. 07/940,026 filed on Sep. 2, 1992, now U.S. Pat. No. 5,272,257.

FIELD OF THE INVENTION

The present invention relates generally to semiconductor technology, and more particularly, to vertically raised transistors.

BACKGROUND OF THE INVENTION

Isolation of adjacent semiconductor devices is an important structural consideration when manufacturing integrated circuits. Isolation is critical for improving integrated circuit yield and performance. In most cases, in order to improve device isolation, integrated circuit surface area increases or integrated circuit process complexity increases.

For example, most integrated circuits are manufactured using metal oxide semiconductor (MOS) field effect transistor (FET) technology. The most commonly used MOS-FET technology for integrated circuit (IC) fabrication is known as complementary MOS (CMOS). CMOS devices, or other known IC devices, are conventionally isolated by field oxide which is usually formed as a thermally grown oxide layer. As semiconductor film thicknesses and lithographic features shrink, the field oxide isolation structures do not scale downward accordingly. Therefore, field oxide isolation structures and similar technologies, such as local oxidation of silicon (LOCOS), polysilicon buffered LOCOS (PBL), and the like, may not provide sufficient circuit density or sufficient isolation for future IC designs.

Trench or dielectric plug isolation is sometimes used to improve isolation between adjacent devices. Trench isolation or dielectric plug isolation increases process complexity and introduces etch damage into an integrated circuit substrate. Interface states and etch damage increase undesirable leakage currents within the integrated circuit. In addition, process integration of trench isolation results in gate oxide reliability problems and device defectivity problems.

In order to achieve further isolation, a modified field oxide approach is used wherein epitaxial growth is utilized to grow substrate material vertically and/or laterally over a field oxide region. The grown epitaxial regions are then used to form lateral transistors which are conventional (i.e. identical to conventional top-contacted bipolar and top-contacted MOS transistors). Although the method of epitaxially growing adjacent and/or over oxides improved isolation, the transistor devices which are formed within the grown epitaxial region have surface areas which are large due to electrical contacts methodologies and lithographically defined features, such as gate electrodes, source and drains, and contacts.

Another form of isolation is achieved via the use of silicon on insulator (SOI) technology or a similar technology, such as silicon on sapphire (SOS). Many different SOI processes and devices exist but most SOI processes result in a device-quality substrate material, such as single-crystalline silicon, entirely overlying a dielectric layer wherein the device-quality substrate material is not connected to the substrate. In another form, an SOI structure may be formed which has a source region, a drain region, and a channel region formed overlying a dielectric layer wherein only the channel region is connected to the substrate by a conductive plug region.

SOI transistors provide improved isolation over field oxide approaches and most SOI transistors have several advantages over planar substrate-formed transistors. Some of these advantages are the absence of latch-up in SOI, higher soft-error immunity and reduced parasitic capacitance. SOI transistors with no substrate or body contact suffer from a known and understood "kink effect", suffer from a known and understood "snap-back" phenomenon (which is similar to the "kink effect"), and have an undesirable parasitic bipolar transistor. SOI transistors with a substrate contact tend to have no "kink effect" or "snap-back" problems and may allow for adjustable threshold voltages and noise margins due to substrate biasing and the known and understood body effect.

Therefore, SOI transistors with a substrate contact have advantages and disadvantages, and SOI transistors without a substrate contact also have advantages and disadvantages. Neither SOI transistor is optimal in all cases and applications. In most cases, the most desirable SOI transistor is a thin-film SOI device which operates in a fully-depleted mode of operation. A thin-film SOI transistor operating in a fully-depleted mode of operation reduces "kink effect", has low electric fields, has a high transconductance, has excellent short channel behavior, and has a quasi-real subthreshold slope. SOI processing tends to be complex or unreliable. For example, seperation by implantation of oxygen (SIMOX), which is used to form SOI devices, is a high temperature process and may produce substrate defects which degrade device performance.

Therefore, the need exists for an improved isolation structure and an improved method of isolation formation wherein the method is not complex. In addition, the structure should result in isolation which is superior to field oxide isolation, result in minimum device separation, and result in reduced device surface area. Furthermore, a flexible, dynamic, and easy to manufacture SOI device is desired for improved isolation and improved device performance.

SUMMARY OF THE INVENTION

The previously mentioned disadvantages are overcome and other advantages achieved with the present invention. In one form, the present invention comprises a vertically raised transistor and method of formation. A substrate having a surface is provided. A first dielectric layer is formed to overlie the substrate. A doped layer is formed to overlie the first dielectric layer. The doped layer is doped with dopant atoms. A second dielectric layer is formed to overlie the doped layer. A portion of the first dielectric layer, a portion of the doped layer, and a portion of the second dielectric layer are removed to form an opening which exposes the surface of the substrate and forms a sidewall of the doped layer. A conductive plug region is selectively formed within the opening. The conductive plug region is adjacent the doped layer and connected to the doped layer by a sidewall connection. Dopant atoms are driven out of the doped layer into the conductive plug region to form both a source and a drain region of said transistor. The source and drain regions are physically separated by a channel region. A gate electrode is formed overlying the channel region.

In another form, the invention comprises a vertical transistor overlying a substrate. The vertical transistor has a first current electrode, a second current electrode which overlies the first current electrode, a channel region which separates the first current electrode from the second current electrode, and a gate electrode which is adjacent the channel region. A lateral vertically raised transistor is formed to overlie the vertical transistor wherein a portion of the lateral transistor is electrically coupled to the second current electrode of the vertical transistor.

In yet another form, the present invention comprises forming a first conductive layer. A vertical P-channel transistor is formed. The vertical P-channel transistor has a first current electrode electrically coupled to the first conductive layer, a second current electrode which overlies the first current electrode, a channel region which separates the first current electrode from the second current electrode, and a gate electrode which is adjacent the channel region. A vertical N-channel transistor is formed in close proximity to the vertical P-channel transistor. The vertical N-channel transistor has a first current electrode electrically coupled to the first conductive layer, a second current electrode which overlies the first current electrode, a channel region which separates the first current electrode from the second current electrode, and a gate electrode which is adjacent the channel region. A second conductive layer is formed to overlie the first conductive layer. The second conductive layer is electrically coupled to the second current electrode of the vertical P-channel transistor and is electrically coupled to the second current electrode of the vertical N-channel transistor.

The present invention will be more clearly understood from the detailed description below in conjunction with the accompanying drawings.

DESCRIPTION OF A PREFERRED EMBODIMENT

Figure 1:
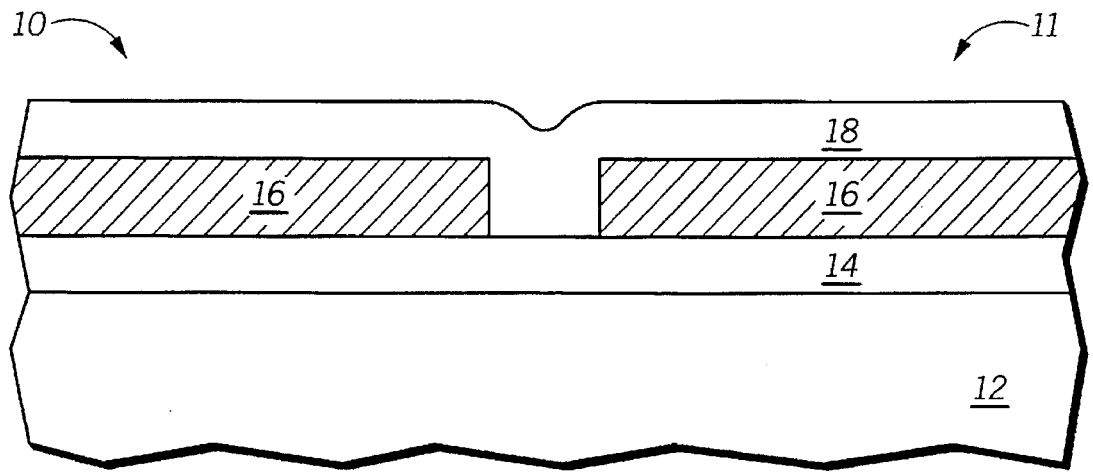
FIGS. 1–6 illustrate, in cross-sectional form, a method for forming two vertically raised transistors, each transistor being in accordance with the present invention.

Illustrated in FIG. 1 is a structure suitable for formation of a transistor 10 and a transistor 11. A substrate 12 is provided. Substrate 12 preferably has a top planar surface prior to semiconductor processing. Substrate 12 is formed having a conductivity type which is one of either a P-type conductivity or an N-type conductivity if the substrate 12 is silicon-based. Substrate 12 may be made of silicon, gallium arsenide, silicon on insulator (SOI) structures, epitaxial formations, germanium, germanium silicon, polysilicon, amorphous silicon, and/or like substrate, semiconductive, or conductive materials. Preferably, the substrate 12 is made of single-crystalline silicon, and is usually doped with boron, phosphorus, or arsenic atoms.

A dielectric layer 14 is formed overlying the substrate 12. Dielectric layer, as used herein, is defined to be any insulator such as wet or dry silicon dioxide ($SiO_2$), silicon nitride, tetraethylorthosilicate (TEOS) based oxides, borophosphosilicate-glass (BPSG), phospho-silicate-glass (PSG), borosilicate-glass (BSG), oxide-nitride-oxide (ONO), oxynitride materials, plasma enhanced silicon nitride (P-$SiN_x$), a spin on glass (SOG), titanium oxide, and/or like dielectric materials or composite dielectric films. A specific dielectric material will be cited when a specific dielectric material is preferred. Dielectric layer 14 is preferably a TEOS based oxide or a silicon dioxide layer.

A conductive layer 16 is formed overlying the dielectric layer 14. Conductive layer, as used herein, is defined to be any silicided layer, a salicided layer, a semiconductive layer, or a conductive layer, such as metallic materials, polysilicon, silicon germanium, metallic composites, refractory metals, conductive composite materials, epitaxial regions, amorphous silicon, titanium nitride, or like conductive materials. Preferably, conductive layer 16 is a polysilicon layer which is doped with dopant atoms. Dopant atoms are usually arsenic and/or phosphorus atoms for N-type material or boron atoms for P-type material. The conductive layer 16 is lithographically defined and etched into two distinct sections as illustrated in FIG. 1. The two distinct sections of the conductive layer 16 may be of a different conductivity type (i.e. one section is N-type and the other section is P-type). This difference in doping is used to form either N-channel or P-channel transistors. Known masking and ion implanting techniques are used to alter the doping of portions of conductive layer 16. Conductive layer 16 is optionally silicided/salicided.

A dielectric layer 18 is formed overlying the conductive layer 16. The dielectric layer 18 is preferably a TEOS based oxide.

Figure 2:
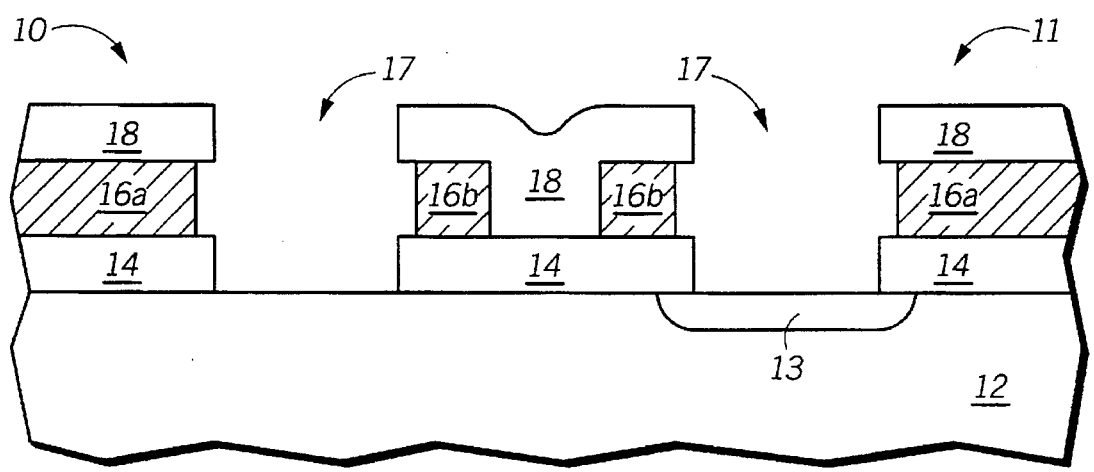

In FIG. 2, openings 17 are formed through the layers 18, 16, and 14. The openings 17 separate the conductive layer 16 into four electrically isolated regions. For example, the openings 17 of transistor 10 forms a conductive region 16a and a conductive region 16b. The opening 17 of transistor 11 forms a conductive region 16c and a conductive region 16d. The openings 17 form sidewalls of the regions 16a, 16b, 16c, and 16d. An optional diffusion 13 may be formed within the substrate 12. Diffusion 13 may be floating or biased to a voltage potential. Diffusion 13 may be used to further isolate transistor 11 from transistor 10 or may be used to alter a known and understood body effect of transistor 11.

In some cases, an optional isotropic etch step may be used to laterally recess the sidewalls of regions 16a, 16b, 16c, and 16d as illustrated in FIG. 2. The method used to etch the opening 17 when lateral recessing is desired is to first reactive ion etch (RIE) or anisotropic etch opening 17 through layers 18 and 16. This etch forms conductive regions 16a, 16b, 16c, and 16d, and dielectric layer 14 is not etched at this time. An isotropic second etch step is used to laterally recess the sidewall of the regions 16a through 16d. The dielectric layer 14 protects the substrate 12 from the isotropic etch step. Once the isotropic etch step is completed. An RIE etch or a like etch is used to further etch the opening 17 through the dielectric layer 14.

In general, oxides may be etched using, for example, a $CHF_3$ and $O_2$ plasma or a $C_2F_6$ plasma. Polysilicon may be etched using an HBr and $Cl_2$ plasma or a $CF_4$/oxygen environment. Silicided layers may be etched via a chlorine HBr ambient. In addition, some silicon-containing materials are etched in an $SF_6$ and oxygen environment. Other known etch chemistries exist. Any of the above stated plasma environments may contain one or more inert carrier gases such as Ar, $H_2$, He, $N_2$, or a like inert carrier gas.

Figure 3:
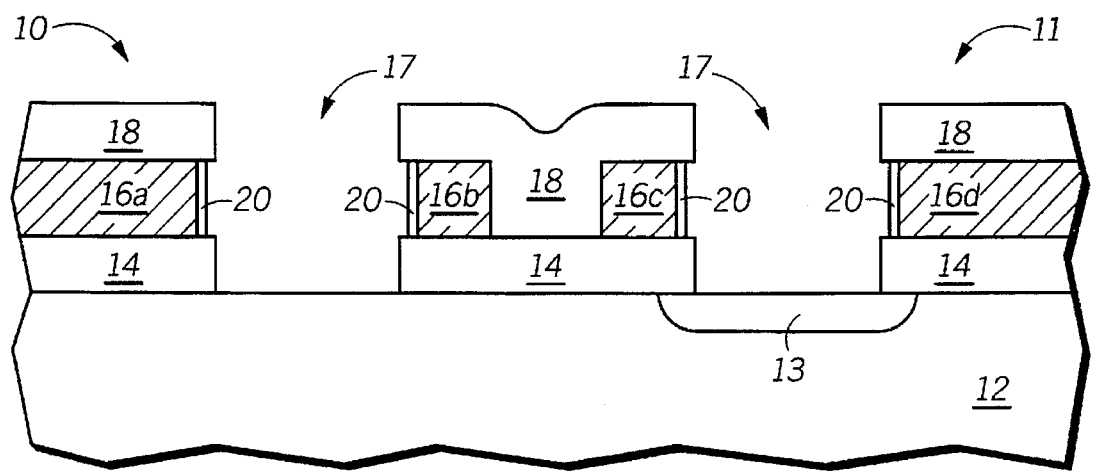

In FIG. 3, sidewall oxide 20 is formed adjacent the sidewalls of each of the regions 16a, 16b, 16c, and 16d. Sidewall oxide 20 is preferably formed in one of two manners. Sidewall oxide 20 may be formed by a selective silicon dioxide growth process. If a growth process is used, a thin dielectric layer (not illustrated) will form on the surface of the substrate 12 if the substrate 12 is exposed. This dielectric layer (not illustrated) may be removed via an RIE etch which will not remove the sidewall oxide 20 due to the fact that the sidewall oxide 20 is formed on laterally recessed sidewalls of regions 16a through 16d. Alternatively, sidewall oxide 20 may be formed by depositing a conformal layer of dielectric material and RIE over-etching to form the sidewall oxide 20. Sidewall dielectric layer 20 is formed to be roughly 20 nm to 60 nm in thickness although other thicknesses are possible.

Figure 4:
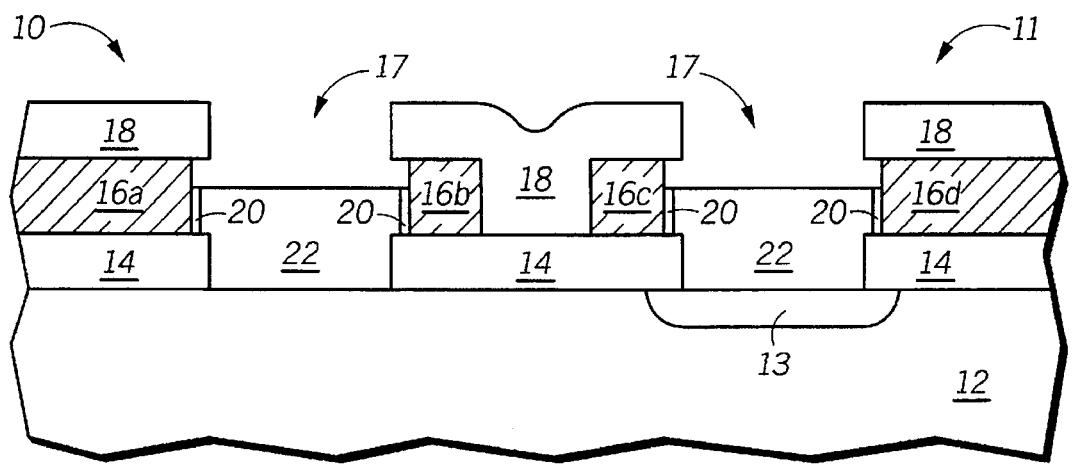

In FIG. 4, a conductive plug region 22 is formed. The conductive plug region 22 may be formed by depositing a layer of conductive material (not illustrated) and etching back, planarizing, or chemical/mechanical polishing (CMP) the layer of conductive material to form conductive plug region 22. The conductive plug region 22 may be in-situ doped upon deposition/growth or be ion implanted with N dopants (i.e. arsenic or phosphorus) or P dopants (i.e. boron). N dopants are used if a P-channel transistor is desired, and P dopants are used if an N-channel transistor is desired. Transistor 10 and transistor 11 may be made of the same conductivity type or of different conductivity types via known photolithographic and masking techniques.

The conductive plug region 22 is preferably formed via an epitaxial growth step. The epitaxial material is grown from the surface of the substrate and is either ion implanted or in-situ doped with dopant atoms as taught herein. The conductive plug region 22 is preferably single-crystalline silicon material although other materials, such as polysilicon may be formed thereby making a structure similar to a polysilicon thin film transistor (TFT).

In FIG. 4, the conductive plug region 22 is formed laterally adjacent a lower portion of the sidewall dielectric 22. An upper portion of the sidewall dielectric 20 is exposed. This portion is isotropic etched in a very brief isotropic etch step which lasts on the order of few seconds to a few minutes. Dielectric layer 18 may be slightly etched during the isotropic etch step depending upon the material composition of dielectric layer 18.

Figure 5:
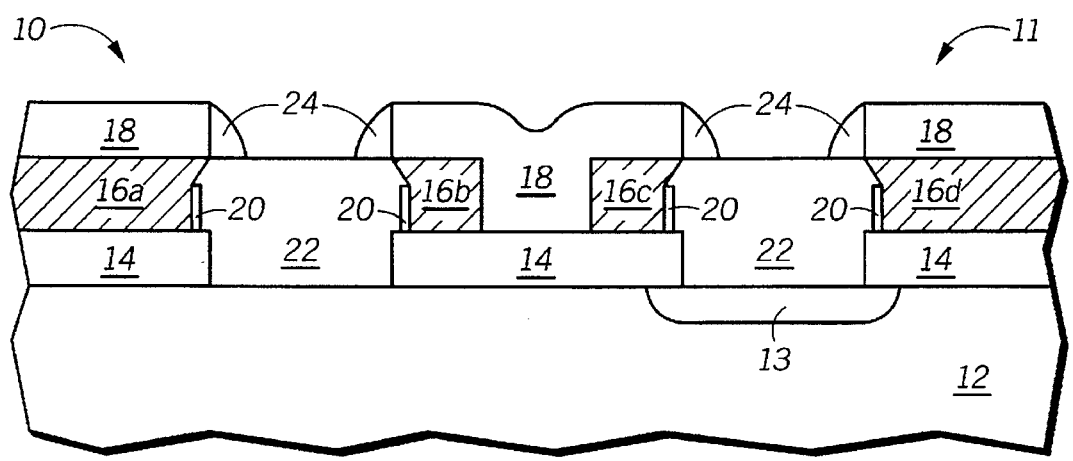

In FIG. 5, the conductive plug region 22 and each of the conductive regions 16a, 16b, 16c, and 16d are epitaxially or selectively grown together as illustrated. A sidewall spacer 24 made of a dielectric material, such as a TEOS-based oxide or a nitride material, is formed adjacent a sidewall of the dielectric layer 18 and within openings 17. Sidewall spacer 24 is used to ensure that no material from conductive regions 16a, 16b, 16c, and 16d is used as a portion of the transistor channel region. Sidewall spacer 24 is also used to reduce capacitive coupling and reduce the chance of electrical short circuiting within transistor 10. Channel regions made of materials such as polysilicon are inferior in many ways to single-crystalline silicon channel regions. Sidewall spacer 24 may not be needed if the process used to grow conductive regions 16a through 16d together with conductive plug region 22 is performed in a manner wherein no material from regions 16a through 16d enter into the space defined as opening 17. Spacer 24 is recommended for process reliability.

Figure 6:
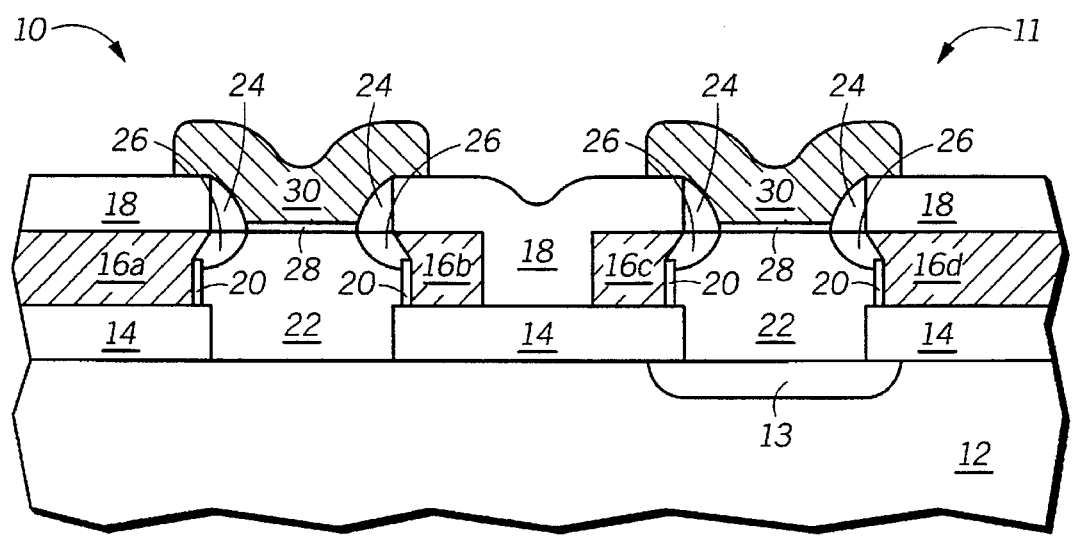

In FIG. 6, a gate dielectric layer 28 is formed overlying the conductive plug region 22 as illustrated. The gate dielectric layer 28 may be formed after a sacrificial oxide step and may be made of silicon dioxide or other known composite gate dielectric materials. A conductive region 30 is formed preferably as a polysilicon layer or a metallic layer. Silicided regions of conductive layer 30 are optional. A channel region (not labeled) is located under the gate dielectric layer 28.

In FIG. 6, dopant atoms are thermally driven from each of the conductive regions 16a, 16b, 16c, and 16d to form current electrode regions 26. Current electrode regions 26 may be either P-type or N-type as discussed herein. The thermal cycle used to form the gate dielectric layer 28 may also be used to drive the dopant atoms to form the current electrode regions 26 and/or a separate thermal cycle may be used. The current electrode regions 26 are symmetrical or nearly symmetrical. Therefore, either of the two current electrode regions 26 within transistor 10 may be a source electrode, or either of the two current electrode regions 26 within transistor 10 may be a drain electrode. The same is true for transistor 11.

The transistors 10 and 11, which are illustrated in FIG. 6, have several advantages over the prior art. For example, the depth of the current electrodes 26 is controlled by the dimension of the connection between conductive plug region 22 and regions 16a through 16d (or in other words, is controlled by the amount on etching performed on sidewall dielectric 20). This dimension or etching is predetermined so that the current electrode regions 26 are shallow. Therefore, short channel effects are reduced.

The spacers 24 allow for a transistor gate length which is less than lithographically allowed. This effective gate length reduction will improve transistor current carrying capability. For example, the opening 17 is formed having a width of three microns and a length of one micron. With no spacer, the width/length ratio is three. If a spacer of 0.25 micron in width is formed around the same opening 17 the effective channel length is 0.5 micron and the effective channel width is 2.5 micron. The channel width/length ratio is now up from three to five. In some cases, the alignment of the opening 17 to the conductive layer 16 is such that the spacer 22 has no effect on transistor width at all. In this case, the spacer 22 is even more effective at increasing current carrying capability without increasing surface area lithographically.

In MOS transistors having a gate length which is equal to or less than 0.35 micron, the thermal diffusion of source and drain regions is a problem. In conventional technology, a lightly doped drain (LDD) implant is placed into the substrate directly adjacent the gate electrode. Therefore, any diffusion of this LDD region results in dopants being moved under the gate electrode. In severe cases, the channel region may be electrically short circuited by the LDD regions. At best, unwanted short channel effects will increase. In FIG. 6, the spacer 22 functions to offset each of the regions 16a through 16d from the gate electrode (i.e. conductive region 30). Therefore, out diffusion is actually desired to achieve a proper gate-to-current-electrode overlap required to reduce series resistance. Therefore, by offsetting the dopant sources which are used to form the current electrode regions 26 from the portion of the gate electrode conductive layer 30 which overlies the gate dielectric layer 28, a disadvantage in the prior art is avoided.

Due to the vertically raised structures of transistors 10 and 11, isolation is improved. For example, the physical conductive distance between the current electrode region 26 which is adjacent the conductive region 16b and the current electrode 26 which is adjacent the conductive region 16c is greater than distances for adjacent planar transistors in conventional technology. This greater distance improves isolation. In addition, conductive plug region 22 doping, diffusion 13, and substrate 12 doping may be used to further improve electrical isolation between devices.

By forming sidewall contacts to the current electrode regions 26 via the regions 16a through 16d, total transistor surface area is reduced. In addition, by not relying on field oxide isolation, by not relying on planar implanted diffusions, and by not relying on conventional top-down contacts, transistors 10 and 11 may be placed closer together. Therefore, surface area is reduced considerably over prior art transistors.

The current electrode regions 26 are diffusions formed from the regions 16a, 16b, 16c, and 16d. Therefore, the doping profile decreases laterally toward the gate dielectric layer 28. This lateral gradient in doping profile is advantageous because the current electrode regions 26 are similar to graded LDD regions which are known to be better than top down implanted LDD regions which have a constant lateral doping profile. Therefore, the current electrode regions 26 may be referred to as graded LDD regions while the conductive regions 16a through 16d may be referred to as highly doped drain (HDD) regions. In addition, if the regions 16a through 16d are salicided, the resistance of the source and drain contacts with decrease.

Due to the spacer 22, known and understood Miller capacitance is reduced. The spacer 22 provides a thick dielectric region between the current electrode regions 26 and the gate conductive layer 30. In addition, the surface area of the current electrode regions 26 are small and junction capacitance is therefore reduced when compared to conventional transistors. The switching speed of a transistor is improved when parasitic capacitances, such as junction capacitance and Miller capacitance, are reduced.

In addition, transistors 10 and 11 and current electrode regions 26 are exposed to a smaller substrate surface area. Therefore, substrate leakage current decreases. This is advantageous when a low power consumption is desired.

By separating the current electrode routing and the gate electrode routing into two separate conductive layers (i.e. conductive layer 16 and conductive layer 30) dense routing and dense transistor packing can be achieved.

Other known and understood effects, such as the body effect and hot carrier injection, may be reduced by the structures illustrated herein and by the doping profiles discussed herein.

Figure 7:
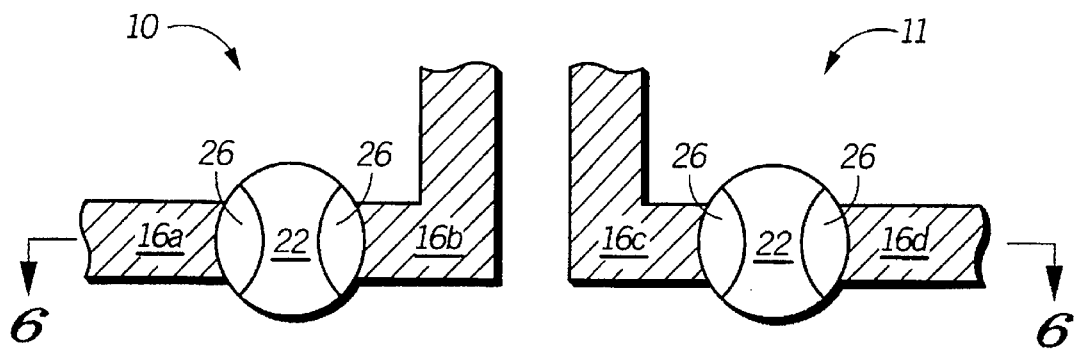
FIG. 7 illustrates in a top perspective view the transistors of FIG. 6.

FIG. 7 illustrates a top perspective view of the transistors 10 and 11 of FIG. 6. Only certain elements of FIG. 6 are represented in FIG. 7 and the elements are identically labeled. FIG. 7 is used to further illustrate the three dimensional structure of FIG. 6. FIG. 7 depicts the conductive plug region 22, the current electrode regions 26, and the conductive regions 16a through 16d. From these elements, the three-dimensional structure of transistors 10 and 11 should be apparent.

Transistors 10 and 11 were formed in FIGS. 1–6 in a manner which allowed for an ideal cross-section. Minimal surface area was not a goal in FIGS. 1–6. Top down embodiments other than FIG. 7 may be used for reduced surface area.

Figure 8:
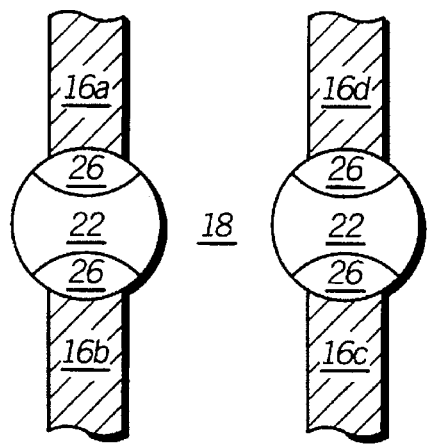
FIG. 8 illustrates in a top perspective view a layout for vertically raised transistors in accordance with the present invention.

For example, FIG. 8 illustrates a top perspective view of two transistors laid out in a manner that further reduces surface area from FIG. 7. In FIG. 8, elements which are analogous to elements in FIGS. 6 and 7 are identically labeled. It is important to note that the openings 17 illustrated herein may be circular, square, rectangular, or any other geometry which allows for formation of a raised vertical transistor.

Figure 9:
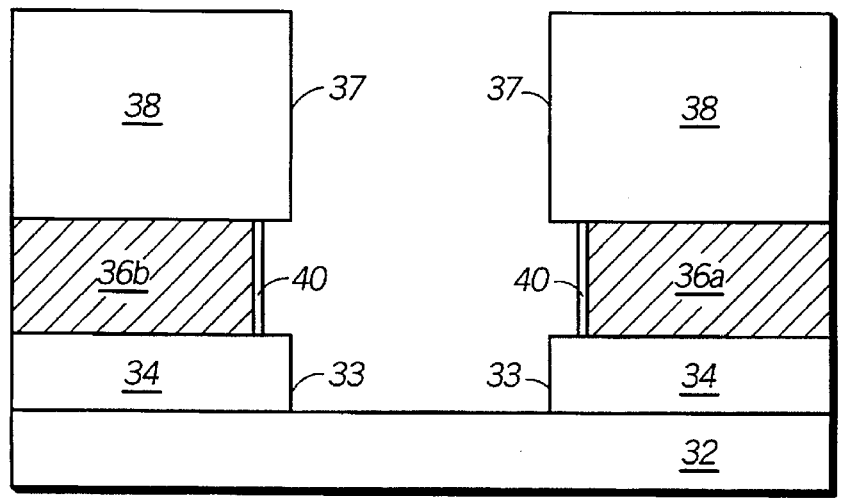
FIGS. 9–14 illustrate, in cross-sectional form, another method for forming a vertically raised transistor in accordance with the present invention.

FIGS. 9–14 illustrate another method which may be used to form a raised vertical transistor. In FIG. 9, a substrate 32, a dielectric layer 34, conductive region 36a and 36b, a dielectric layer 38, and a sidewall dielectric 40, are formed in a manner which is analogous to FIGS. 1–3. An optional diffusion (not illustrated) may be formed within the substrate 32. An opening through dielectric layer 38 is referred to as opening 37 and an opening through the dielectric layer 34 is referred to as opening 33.

Figure 10:
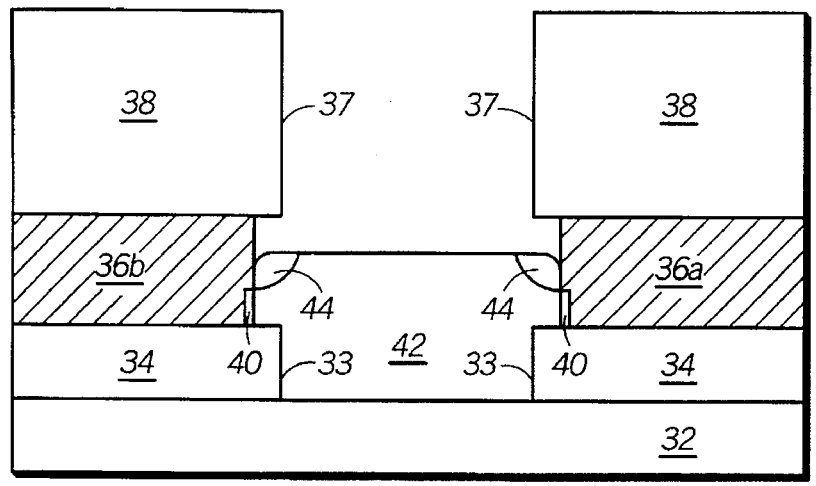

FIG. 10 illustrates the formation of a conductive plug region 42. Conductive plug region 42 is analogous to conductive plug region 22 of FIG. 4 and is formed in a like manner. An isotropic etch step is used to remove a top portion of sidewall dielectric 40 as taught herein. A brief epitaxial or selective growth process is used to connect conductive plug region 42 to regions 36a and 36b as taught herein. Current electrode regions 44 are formed by driving dopant atoms from regions 36a and 36b.

Figure 11:
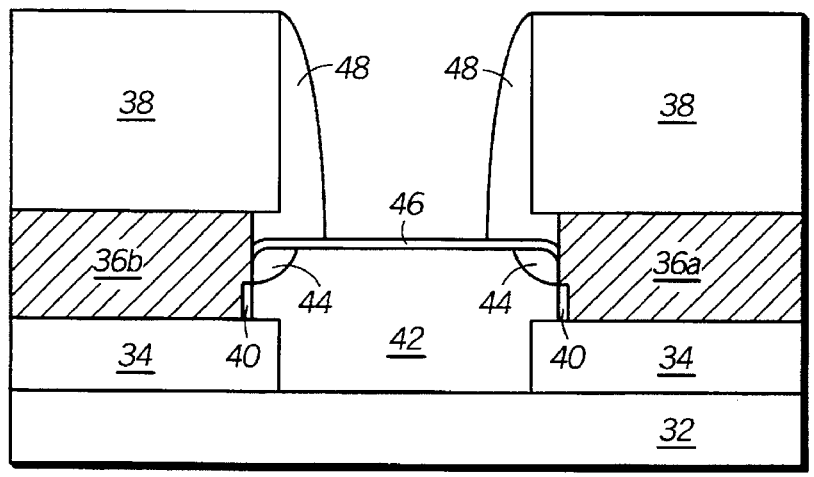

In FIG. 11, a sidewall spacer 48 is formed adjacent a sidewall of the dielectric layer 38 as illustrated. The spacer 48 is preferably silicon nitride or a material which can be removed selectively to TEOS and polysilicon, such as titanium oxide, germanium oxide, or the like. A gate dielectric layer 46 is formed overlying the conductive plug region 42. The gate dielectric layer 46 may also form along a sidewall of the regions 36a and 36b.

Figure 12:
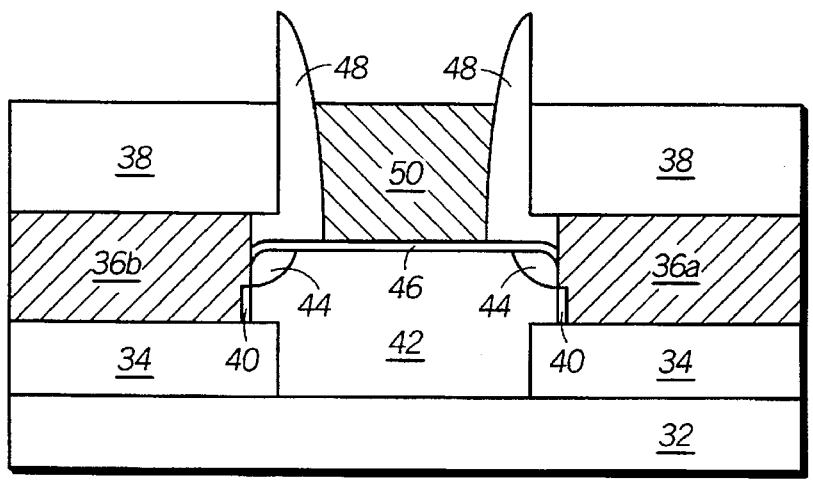

In FIG. 12, a conductive region 50 is formed which functions as a gate electrode for the transistor of FIG. 12. The dielectric layer 38 is etched back to form a portion of spacer 48 which is free-standing.

Figure 13:
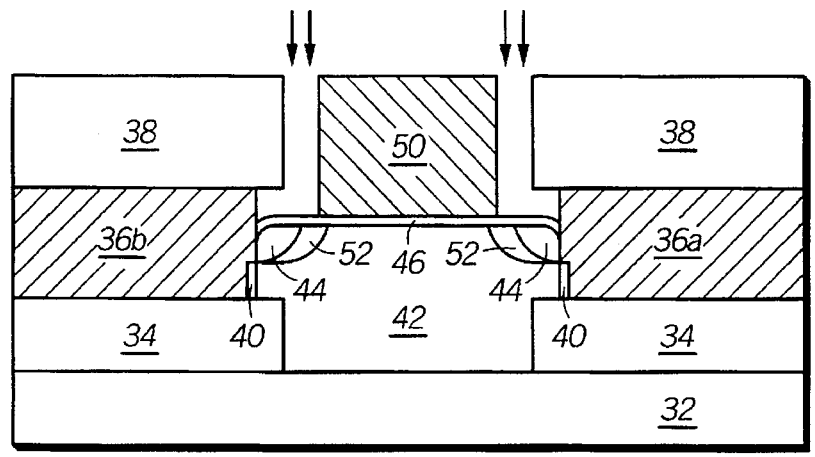

In FIG. 13, the spacer 48 is removed via an isotropic and/or RIE etch. Portions of the spacer 48 are optionally masked during this etch step (illustrated in a subsequent figure). The etch is selective to dielectric layer 38, conductive plug region 42, conductive regions 36a and 36b, and conductive regions 50. For example, a hot phosphoric isotropic etch may be used to perform this step if nitride spacers are used. The removal of spacer 48 forms an opening which exposes a peripheral portion of the conductive plug region 42.

Dopants are implanted through the opening illustrated in FIG. 13. To form diffusions 52. Therefore, the current electrode regions 44 and the diffusions 52 form a double-graded LDD structure for the device illustrated in of FIG. 13.

Figure 14:
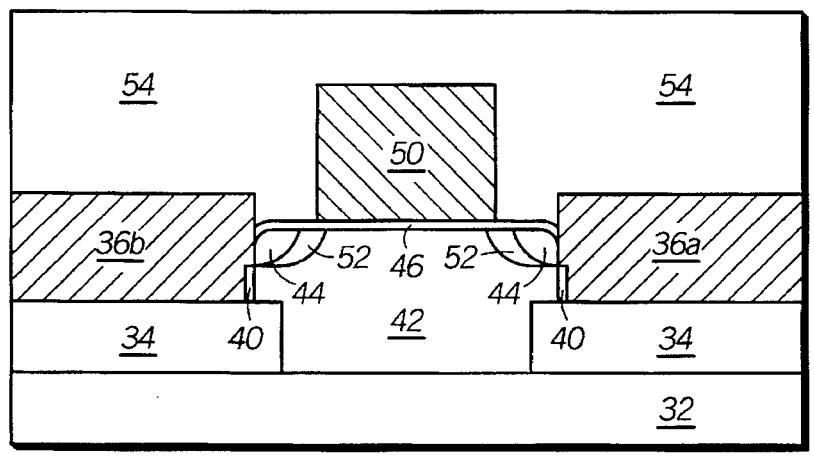

In FIG. 14, a dielectric layer 54 is formed overlying the conductive region 50 and the conductive regions 36a and 36b. Dielectric layer 54 may have a bottom portion which is the dielectric layer 38 or dielectric layer 38 can be removed prior to dielectric layer 54 formation. The transistor illustrated in FIG. 14 is similar to the transistors 10 and 11 and has many of the advantages associated with transistors 10 and 11. The one difference between the transistor of FIG. 14 and the transistors 10 and/or 11 is that the removable spacer 48 allows for the formation of a double-graded current electrode structure. The entire transistor structure of FIG. 14 cannot be completely understood from the cross-sections of FIGS. 9–14 alone.

Figure 15:
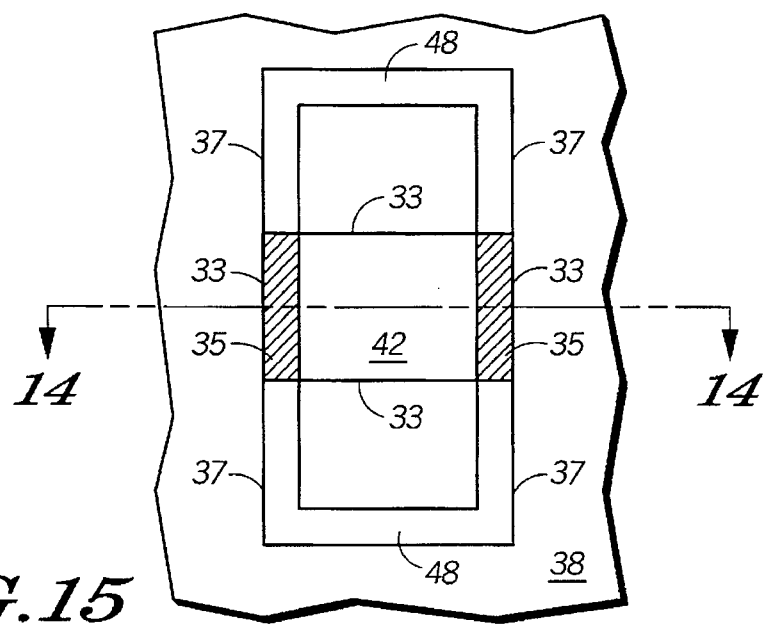
FIG. 15 illustrates in a top perspective view the transistor of FIG. 14.

FIG. 15 illustrates a top down view of one possible embodiment of the structure in FIG. 14. Elements of FIG. 15 which are analogous to elements of FIGS. 9–14 are identically labeled. In this embodiment the opening 37 through dielectric layer 38 is made bigger than the opening 33 through dielectric layer 34. The opening through conductive regions 36a and 36b is roughly the size of opening 33. The spacer 48 is formed around the opening 37. Therefore, when the spacer 48 is removed and an ion implant step occurs, only regions 35 of the conductive plug region 42 will be implanted with dopants to form the diffusions 52. All other ion implant dopant atoms will land on a dielectric material (i.e. dielectric layer 34 or 38) or masking material.

Figure 16:
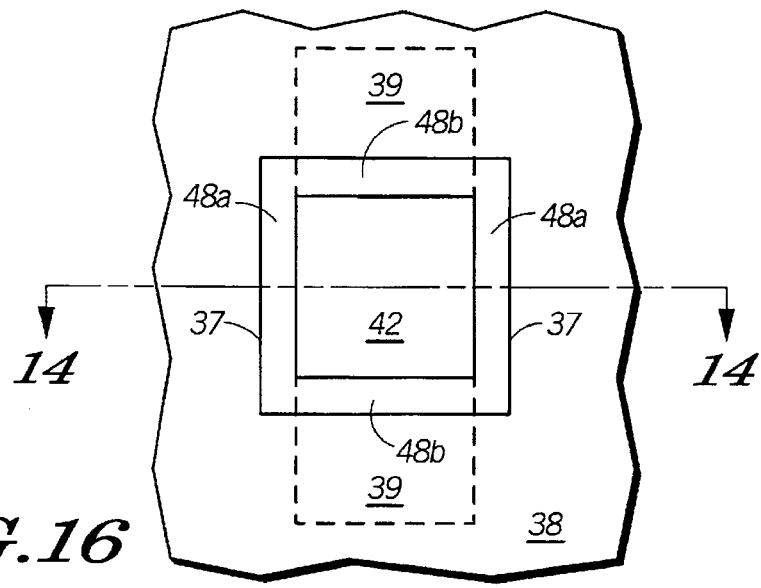
FIG. 16 illustrates in a top perspective view another embodiment of the transistor of FIG. 14.

FIG. 16 illustrates a top down view of another embodiment of the structure in FIG. 14. Elements of FIG. 16 which are analogous to elements of FIGS. 9–14 are identically labeled. In this embodiment the opening 37 through dielectric layer 38 is made the same size as the opening 35 through dielectric layer 34. The opening through conductive regions 36a and 36b is roughly the size of openings 35 and 37 (the isotropic etch may widen a portion of the opening adjacent conductive regions 36a and 36b). The spacer 48 is formed around the opening 37. A masking layer 39 is used to mask a portion of the spacer 48 referred to as spacer portion 48b and expose a portion of the spacer 48 labeled spacer portion 48a. During etching of the spacer 48, the spacer portion 48a is removed and the spacer portion 48b is not removed. Therefore, the ion implant dopant will dope the conductive plug region 42 only in the regions under spacer portion 48a. All other ion implant dopants will land on a dielectric material or masking material (i.e. dielectric layer 38).

Figure 17:
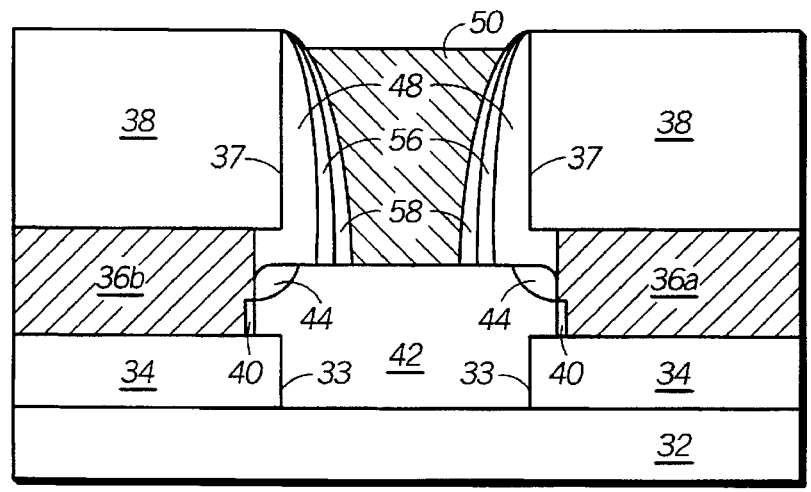
FIG. 17 illustrates, in cross-sectional form, another vertically raised transistor in accordance with the present invention.

FIG. 17 illustrates another vertically raised transistor. The transistor of FIG. 17 is similar to the transistor illustrated in FIG. 14. Therefore, elements of FIG. 17 which are analogous to elements of FIG. 14 are identically labeled. In FIG. 17, one or more spacers, for example spacers 48, 56, and 58, are formed adjacent a sidewall of dielectric layer 38. The spacers 48, 56, and 58 are formed of a material such as BSG, PSG, or a like doped oxide which contains dopant atoms. Each spacer 48, 56, and 58 has a different concentration of dopant atoms to form a graded doping profile. During thermal processing, dopant atoms are driven out of the spacers 48, 56, and 58 to form a graded LDD structure.

Once again, in order to avoid electrically short circuiting the source electrode to the drain electrode, top perspective embodiments analogous to FIGS. 15–16 are used for the structure illustrated in FIG. 17. These embodiments are illustrated in FIGS. 18–19.

Figure 18:
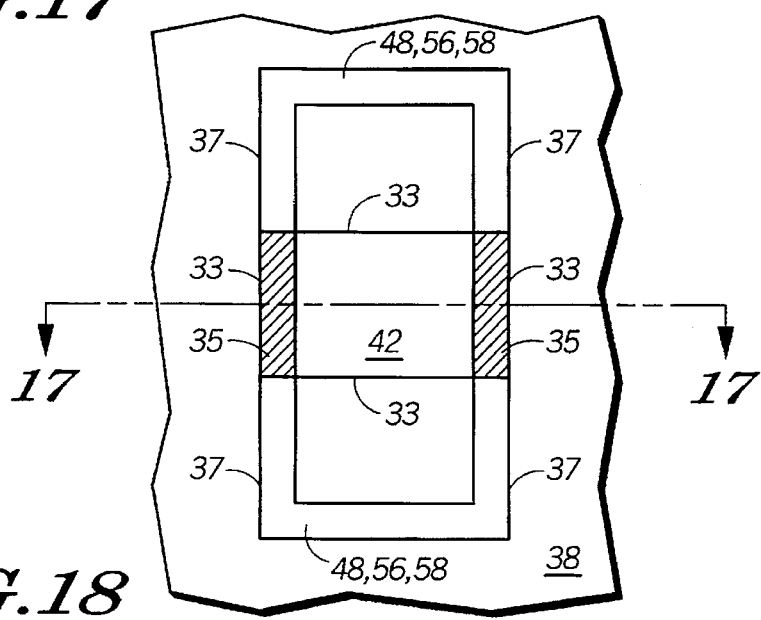
FIG. 18 illustrates in a top perspective view the transistor of FIG. 17.

FIG. 18 illustrates a top down view of one possible embodiment of the structure illustrated in FIG. 17. Elements of FIG. 18 which are analogous to elements of FIG. 17 are identically labeled. In this embodiment the opening 37 through dielectric layer 38 is made bigger than the opening 35 through dielectric layer 34. The opening through conductive regions 36a and 36b is roughly the size of opening 35. The spacers 48, 56, and 58 are formed around the opening 37. Therefore, the dopant atoms from the spacers 48, 56, and 58 will only dope regions 35 of the conductive plug region 42. All other dopant atoms will remain in a dielectric material and be electrically inactive.

Figure 19:
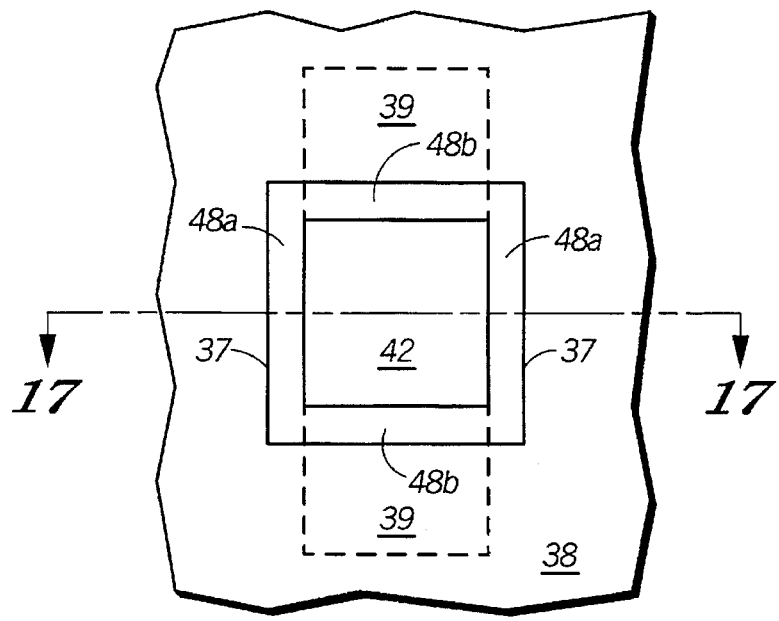
FIG. 19 illustrates in a top perspective view another embodiment of the transistor of FIG. 17.

FIG. 19 illustrates a top down view of another embodiment of the structure in FIG. 17. Elements of FIG. 19 which are analogous to elements of FIG. 17 are identically labeled. In this embodiment the opening 37 through dielectric layer 38 is made the same size as the opening 35 through dielectric layer 34. The opening through conductive regions 36a and 36b is roughly the size of openings 35 and 37 (the isotropic etch may widen the opening adjacent conductive regions 36a and 36b). The spacers 48, 56, and 58 are formed around the opening 37. A masking layer having an opening 39 is used to mask a portion of the spacers 48, 56, and 58 referred to collectively as a spacer portion 48a and expose a portion of the spacers 48, 56, and 58 labeled collectively as a spacer portion 48b. During etching of the spacers 48, 56, and 58, the spacer portion 48b is removed and the spacer portion 48a is not removed. Therefore, the dopant atoms which are thermally driven from spacers 48, 56, and 58 will dope the conductive plug region 42 only in the regions under spacer portion 48a. All other dopants will remain in a dielectric material (i.e. dielectric layer 38 or spacers 48, 56, 58) or be removed via etching.

FIGS. 20–26 illustrate another method for forming a vertically raised transistor. Due to the fact that FIGS. 20–26 illustrate another embodiment, much of the processing steps will not be discussed in detail due to the fact that many of the processing steps of FIGS. 20–26 are already taught above.

Figure 20:
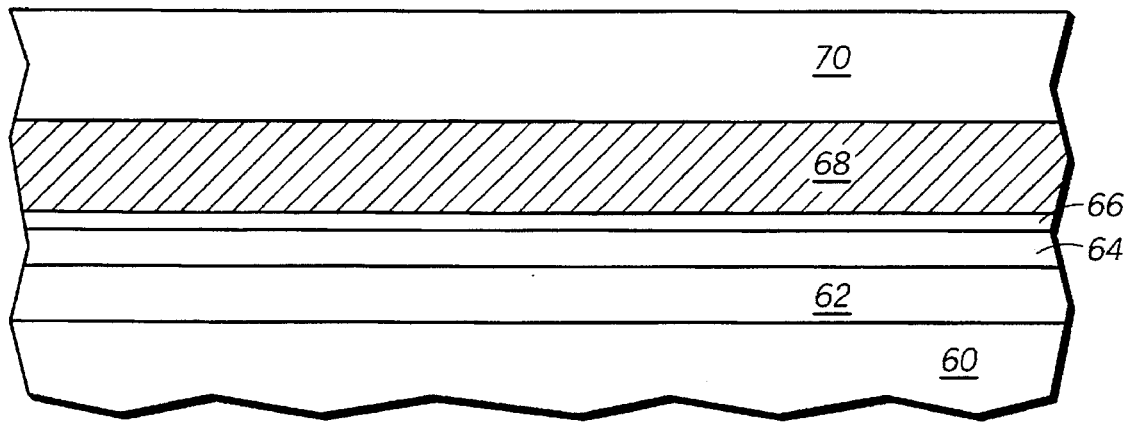
FIGS. 20–26 illustrate, in cross-sectional form, another embodiment of the vertically raised transistor in accordance with the present invention.

FIG. 20 illustrates a substrate 60, a dielectric layer 62 (preferably TEOS or silicon dioxide), a dielectric layer 64 (preferably silicon nitride), a doped dielectric layer 66 (preferably PSG or BSG), a conductive layer 68 (preferably polysilicon and optionally silicided), and a dielectric layer 70 (preferably TEOS) are illustrated in a vertically stacked structure.

Figure 21:
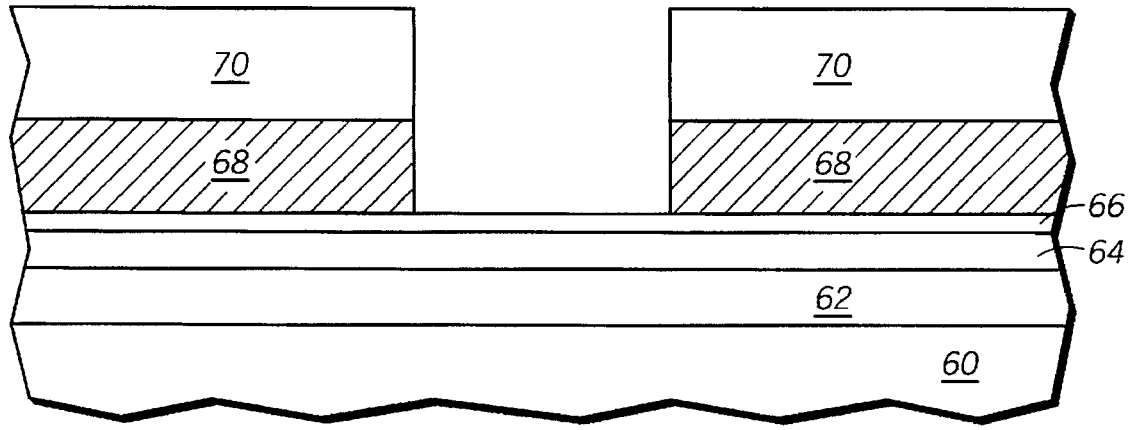

In FIG. 21, an opening is formed through layers 70 and 68. The opening forms a sidewall of conductive layer 68 and exposes the doped dielectric layer 66. RIE etching is preferred for the formation of the opening. The opening separates the conductive layer 68 into two distinct regions.

Figure 22:
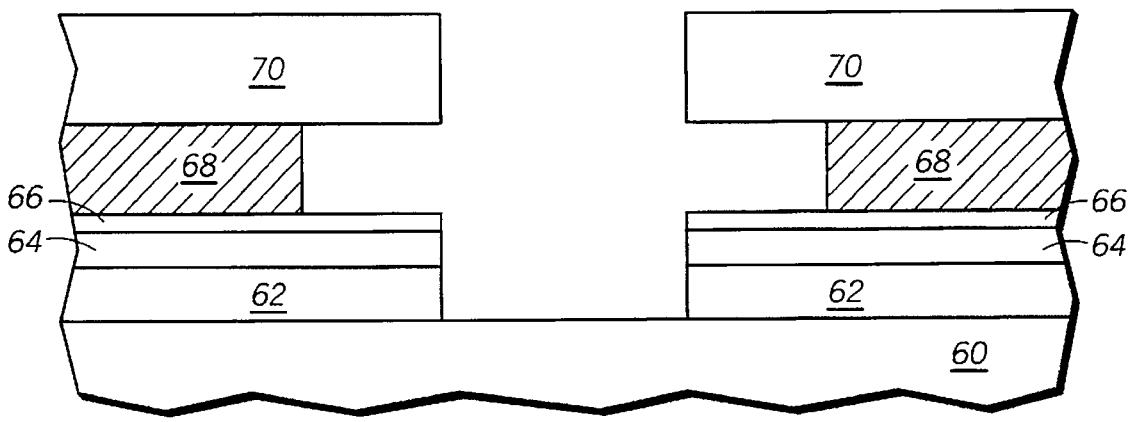

In FIG. 22, an isotropic etch step is used to laterally recess the sidewall of the conductive layer 68. RIE etching is then performed to extend the opening through the layers 62, 64, and 66. The opening now exposes a surface of the substrate 60.

Figure 23:
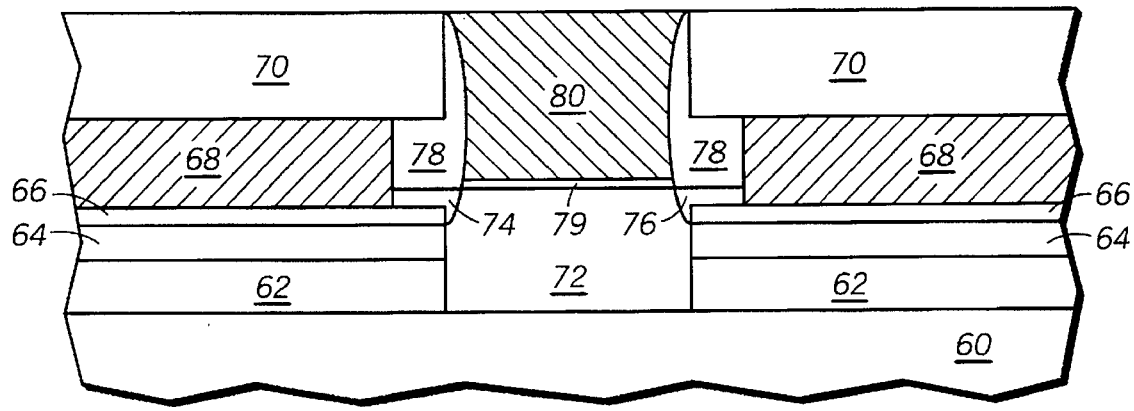

In FIG. 23, a selective or epitaxial growth process is used to grow the conductive layer 68 together with a conductive region 72. The conductive region 72 is grown from the surface of the substrate 60. A thermal oxide 79 or a like gate dielectric is formed overlying the conductive region 72. The thermal processing used to grow thermal oxide 79 is also used to drive dopant atoms from the doped dielectric layer 66 and to optionally drive dopant atoms from the conductive layer 68 to form source region 74 and drain region 76. The source region 74 and drain region 76 are usually symmetrical and therefore interchangeable. A sidewall spacer 78, which is preferably silicon nitride, is formed adjacent the sidewall of the conductive layer 68 and overlying the source region 74 and drain region 76. A conductive layer 80 is formed as a gate electrode.

Figure 24:
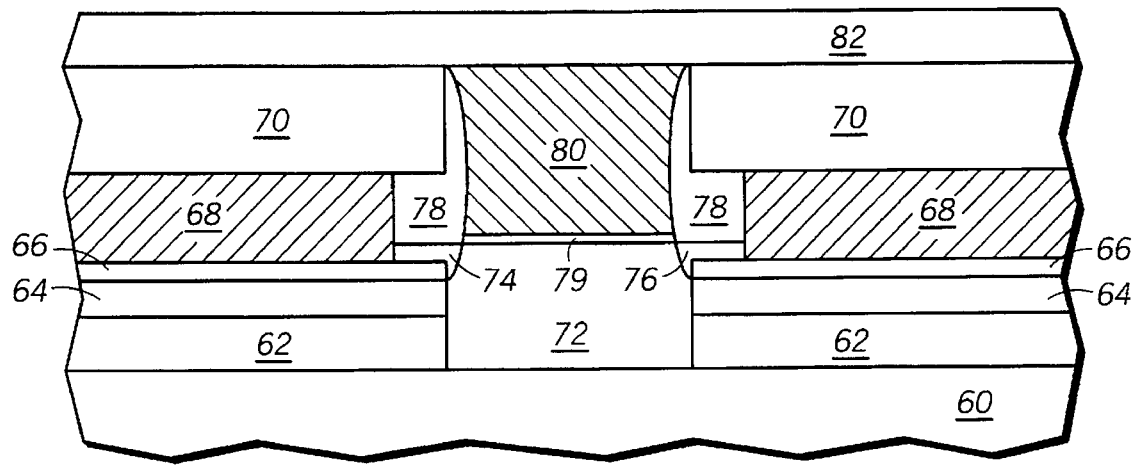

In FIG. 24 a dielectric cap layer 82 is formed to protect and insulate the conductive region 80.

Figure 25:
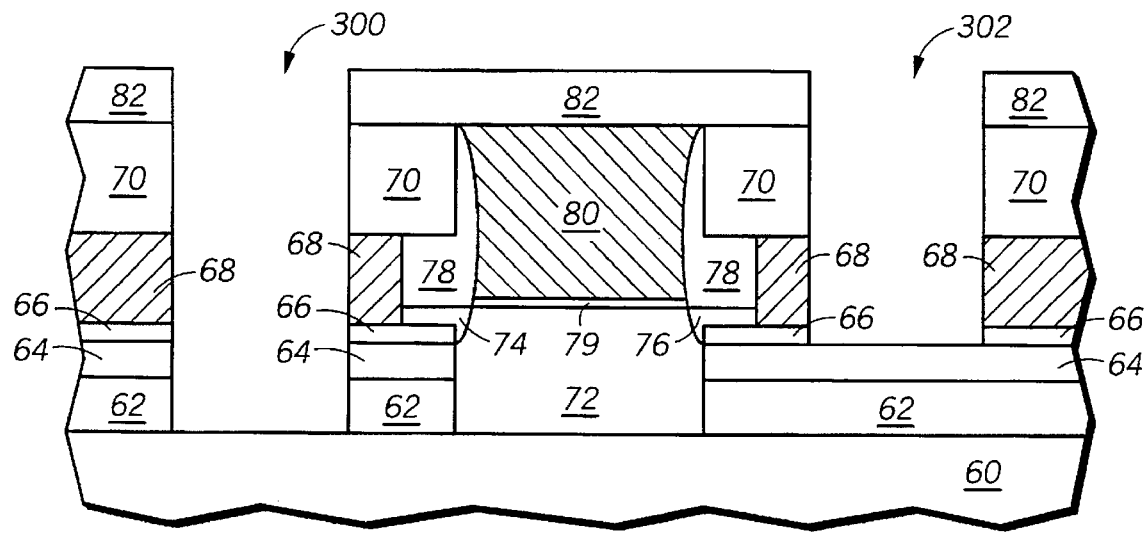

FIG. 25 illustrates an opening 300 and an opening 302. The opening 300 is formed through layers 82, 70, 68, 66, 64, and 62 to expose a portion of the substrate 60 and form a sidewall of the conductive layer 68. The opening 302 is formed through layers 82, 70, 68, and 66 and formed a sidewall of conductive layer 68. Openings 300 and 302 illustrates two structures which may be used to electrically contact a vertically raised transistor. Many other contact schemes exist in the prior art.

Figure 26:
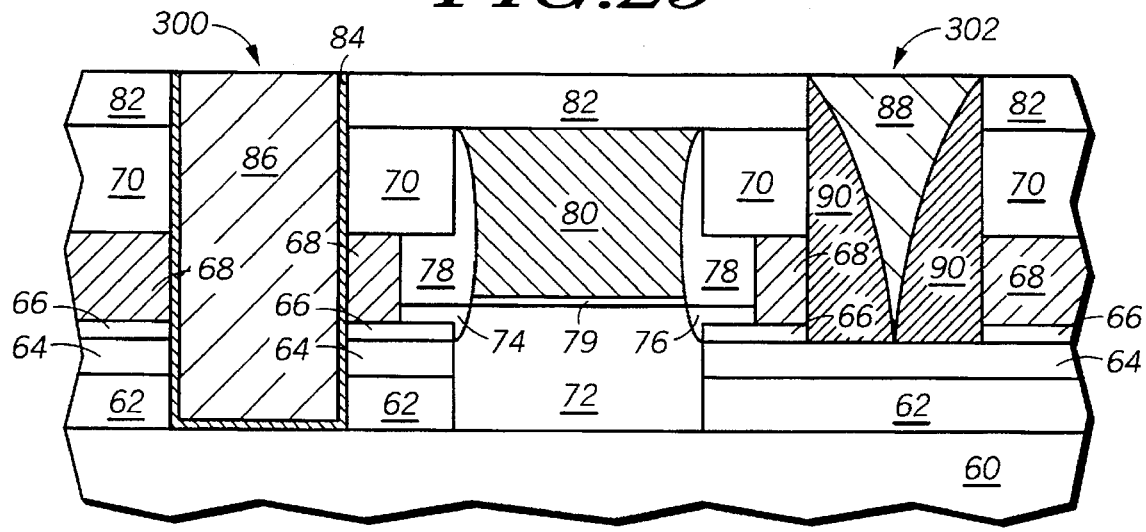
Figure 27:
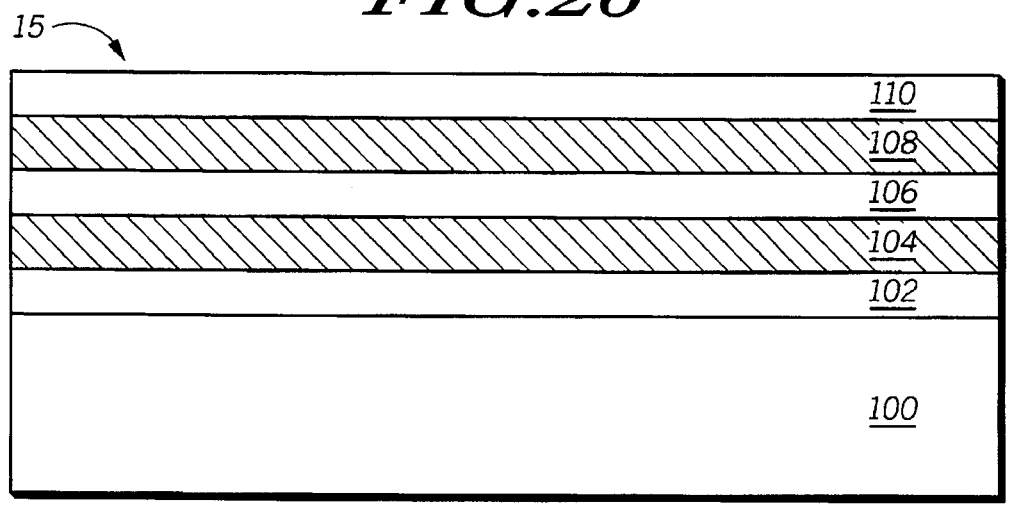
FIGS. 27–28 illustrate, in cross-sectional form, initial steps towards forming another form of the vertically raised transistor in accordance with the present invention.

In FIG. 26, opening 300 is partially filled with a barrier layer 84. The barrier layer 84 may be a titanium nitride layer, a titanium/tungsten layer of a like known barrier layer. The barrier layer 84 may be a composite material. A conductive plug region 86 is formed within the opening 300. The conductive plug region 86 may be a silicide material such as platinum silicide, cobalt silicide, titanium silicide, tungsten silicide, or the like, a refractory metal (such as tungsten), polysilicon, gold, copper, aluminum or a like conductive or semiconductive material. The conductive plug region 86 may also be used to form a built-in resistor or capacitor. It should be noted that many contact technologies exist in the prior art. Any conductive plug or contact structure may be used to form an electrical contact within the opening 300. The conductive plug region 86 forms an electrical contact to conductive region 68 and the substrate 60.

FIG. 26 illustrates another contact structure which may be used to contact the vertically raised transistor. A conductive spacer 90 is formed within the opening 302. Conductive spacer 90 may be polysilicon or a like conductive material. A conductive region 88 is formed within the opening. Conductive region 88 is a silicided material, an epitaxial material, a selectively grown material, or a metallic material. The spacer 90 forms an electrical contact to conductive layer 68.

FIGS. 27–32 illustrate a method for forming a vertically raised transistor with a dynamic electrically-controlled contact to a substrate 100. The vertically raised transistor with a dynamic electrically-controlled contact to the substrate 100 is referred to as a structure 15. A dielectric layer 102 which is preferably TEOS or a silicon dioxide material, a conductive layer 104 which is preferably a silicon-containing material such as polysilicon, a dielectric layer 106 which is preferably TEOS, a conductive layer 108 which is similar to conductive layer 104, and a dielectric layer 110, are formed overlying the substrate 100. The conductive layer 104 and 108 are optionally silicided.

Figure 28:
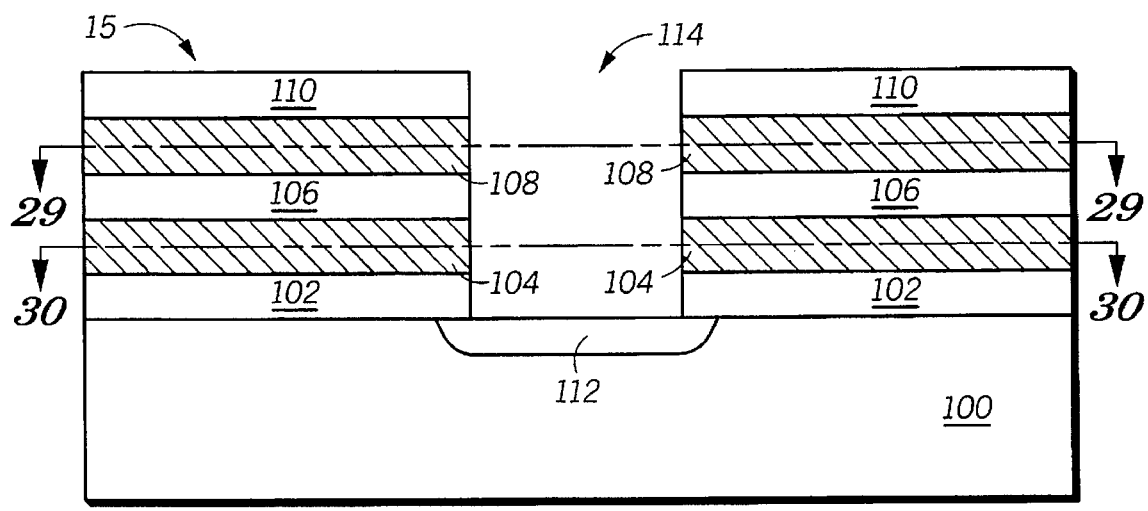

In FIG. 28, an opening 114 is etched through the layers 102, 104, 106, 108, and 110 to expose a surface of the substrate 100. An optional diffusion 112 is formed within the substrate 100. Diffusion 112 may be either N-type or P-type. The opening 114 forms both a sidewall of the conductive layer 108 and a sidewall of the conductive layer 104. Each of these sidewalls may be optionally laterally recessed via isotropic etch techniques which are taught herein.

Figure 29:
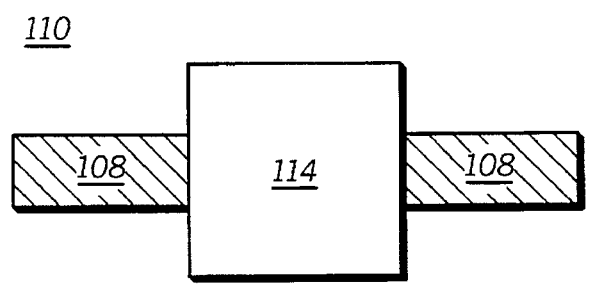
FIG. 29 illustrates in a top perspective view the structure of FIG. 28 cross sectioned along line 29—29.

FIG. 29, illustrates a top perspective view of the structure of FIG. 28 cross-sectioned along a line 29–29. FIG. 29 illustrates that the opening 114 separates the conductive layer 108 into two electrically separate regions.

Figure 30:
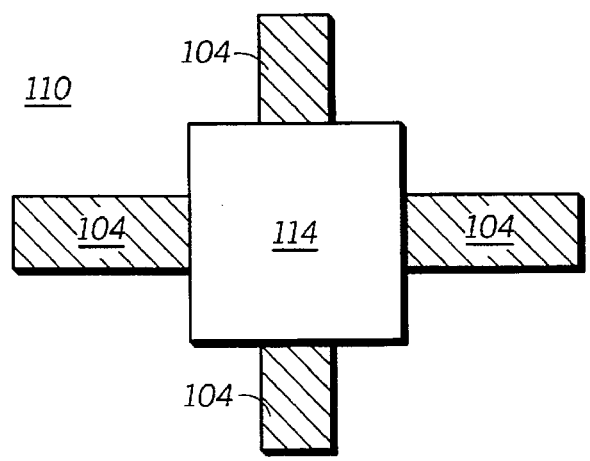
FIG. 30 illustrates in a top perspective view the structure of FIG. 28 cross sectioned along line 30—30.
Figure 31:
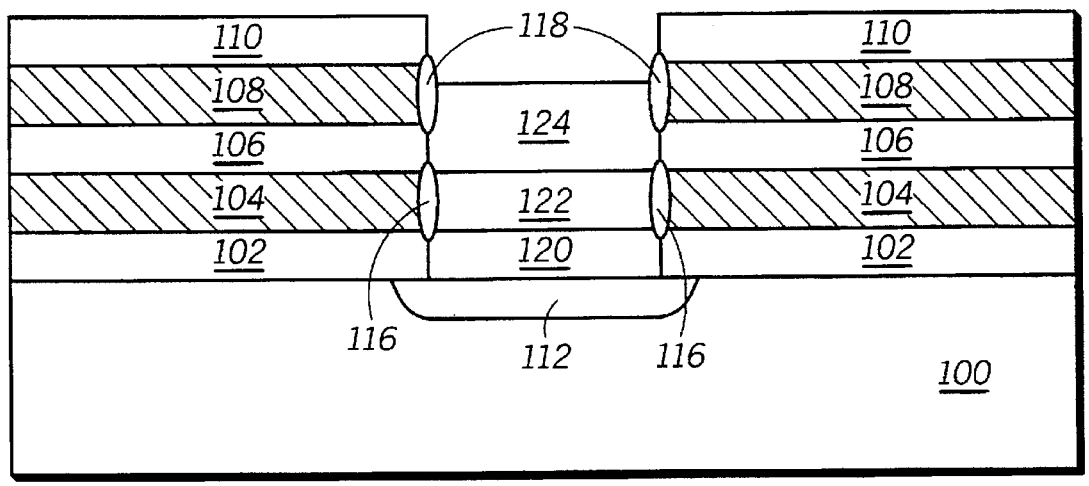
FIGS. 31–32 illustrate, in cross-sectional form, final steps of forming the vertically raised transistor of FIGS. 27–28.

FIG. 30, illustrates a top perspective view of the structure of FIG. 28 cross-sectioned along a line 30—30. FIG. 30 illustrates that the opening 114 separates the conductive layer 104 into four electrically separate regions. It should be noted that the conductive region 104 may be split into N electrically separated regions wherein N is any positive integer. Therefore, region 104 may not be separated into multiple regions (i.e. N=1) or may be separated into two or more regions. In FIG. 31, a sidewall dielectric layer 116 is formed adjacent the sidewall of the conductive layer 104 and a sidewall dielectric layer 118 is formed adjacent the sidewall of the conductive layer 108 as taught herein. A region 120 is epitaxially grown or selectively formed from the surface of the substrate 100 or from a surface of the diffusion 112 if the diffusion 112 is formed. Region 120 is of a first conductivity type which is either N-type or P-type. A region 122 is epitaxially or selectively formed overlying the region 120. The region 122 is of a second conductivity type wherein the second conductivity type is opposite the first conductivity type. Region 122 is formed laterally adjacent the sidewall dielectric layer 116. An epitaxial step or selective formation step is used to form region 124 which is of the first conductivity type. The region 124 lies partially adjacent the sidewall dielectric layer 118. The regions 120, 122, and 124 may be in-situ doped and/or ion implanted with N-type or P-type dopant atoms to achieve the first and second conductivity types.

The regions 120, 122, and 124, the sidewall dielectric layer 116, and the conductive layer 104 form a vertical transistor. The regions 120 and 124 form current electrodes, the region 122 forms a channel region, the sidewall dielectric layer 116 forms a gate dielectric layer, and conductive layer 114 forms N gate electrodes as taught herein. Diffusion 112 may be used to electrically bias/contact the region 120 or may be used to form a doped contact to the substrate 100.

Figure 32:
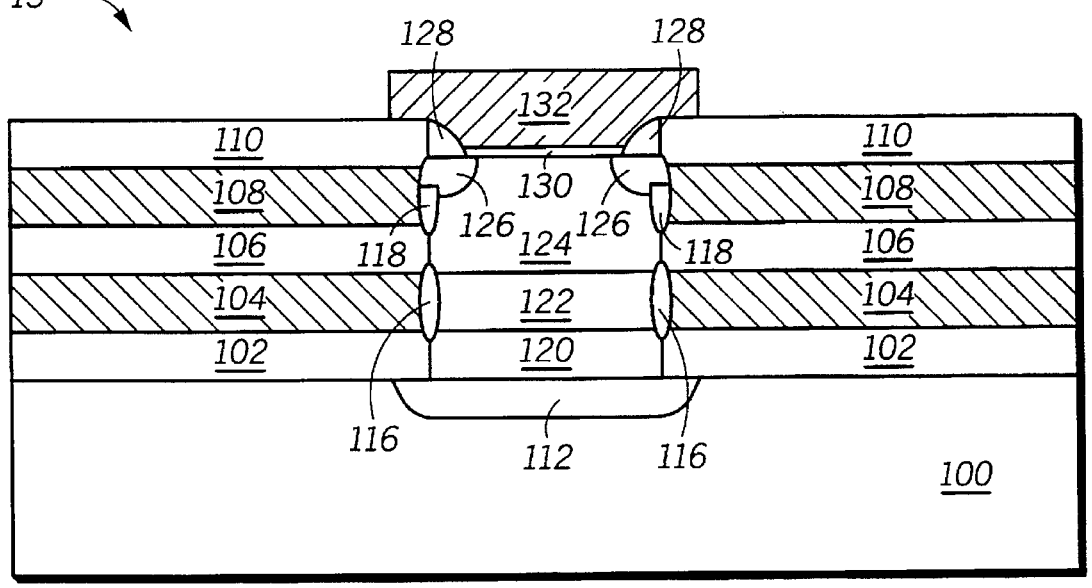

In FIG. 32, a vertically raised lateral transistor similar to the transistors 10 and 11 of FIGS. 1–6 is formed. Due to the fact that the process for forming the vertically raised lateral transistor in FIG. 28 is similar to the process of FIGS. 1–6, only a brief explanation is provided herein. A portion of the region 124 functions as channel region for the vertically raised lateral transistor. Regions 126 functions as current electrodes for the vertically raised lateral transistor. A dielectric layer 130 functions as a gate dielectric. An spacer 128 is formed for reasons described herein, and a conductive region 132 functions as a gate electrode.

FIG. 32 illustrates a structure 15 which has several unique features and advantages. In the prior art, a silicon on insulator (SOI) transistor is formed either having a permanent non-dynamic substrate-to-channel region contact or no substrate-to-channel region contact. By having a substrate-to-channel region contact, an SOI transistor avoids known and understood snap-back and kink effect phenomena. But an SOI transistor with a substrate-to-channel region contact is slower, has larger leakage currents, is less isolated, and has other known disadvantages when compared to an SOI transistor which has no substrate-to-channel region contact.

Structure 15 has an electrically controlled substrate-to-channel region contact (via the vertical transistor) which allows the raised vertical lateral transistor to function as either an SOI transistor with a substrate-to-channel region contact or as an SOI transistor with no substrate-to-channel region contact. Therefore, structure 15 has the advantages of both a substrate-contacted SOI and a floating SOI non-substrate-contacted transistor.

When the vertical transistor of FIG. 32 is "off" or is not conducting current, the structure 15 is operating as an SOI transistor which is not connected to the substrate 100 (or the diffusion 112 if formed). Therefore, structure 15 will have an absence of latch-up problems, higher soft-error immunity, improved speed of operation, reduced leakage currents, reduced parasitic capacitances, and other known SOI advantages. When the vertical transistor is "on" or conducting current, the structure 15 operates as an SOI transistor which has a substrate-to-channel connection. Therefore, the known kink effect, parasitic bipolar transistors, and other known SOI phenomena are eliminated. These two modes of operation (i.e. a substrate contact versus no substrate contact) are electrically controlled/dynamic and are determined by voltages applied to the N gate electrodes formed by conductive layer 104.

The circuit advantages of having a SOI structure wherein a substrate contact is electrically enabled or disabled are numerous. Noise margins may be dynamically adjusted during circuit operation via the vertical transistor of FIG. 32 and various biasing via the substrate 100 or the diffusion 112. Threshold voltages may be dynamically adjusted and altered during operation. In addition, static adjustments may be made to the structure 15. For example, if a precise/optimal noise margin, threshold voltage, or like transistor parameter is desired, process variations usually result in a deviation from these desired precise/optimal values. The structure 15 may be electrically adjusted to compensate for process variations or other variations in performances/tolerances. In addition, if multiple structures similar to structure 15 are formed on an integrated circuit, each structure can be individually fine tuned for optimal performance.

Other advantages include being able to alter the body effect. Altering switching speed, isolation, transistor stability, and leakage current/power consumption may be performed dynamically. The N multiple gate feature of conductive layer 104 allows for the resistance of the substrate-to-channel contact to be dynamically altered. In general, the dynamic operation of structure 15 offers numerous advantages in terms of circuit flexibility and performance, process control and compensation, and circuit design.

Figure 33:
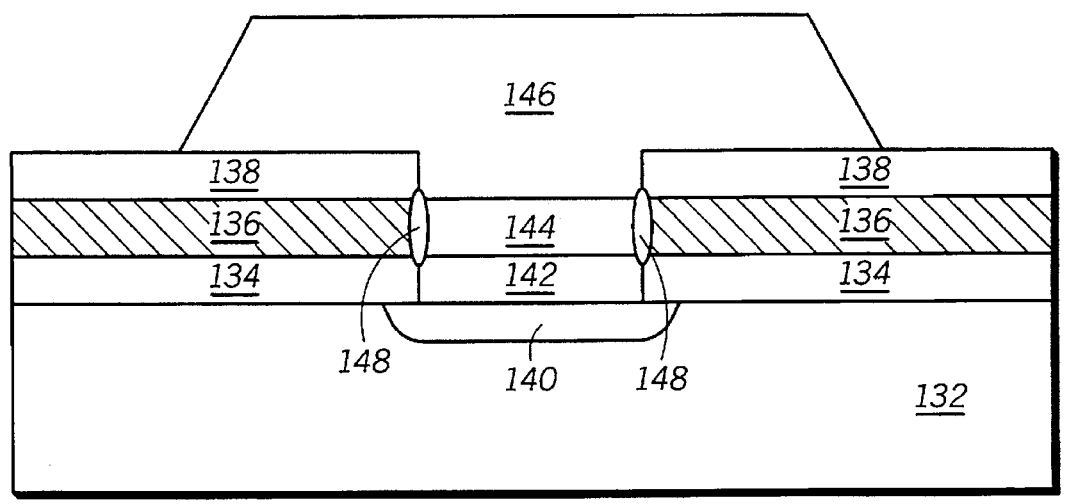
FIGS. 33–34 illustrate, in cross-sectional form, yet another method of forming a vertically raised transistor in accordance with the present invention.
Figure 34:
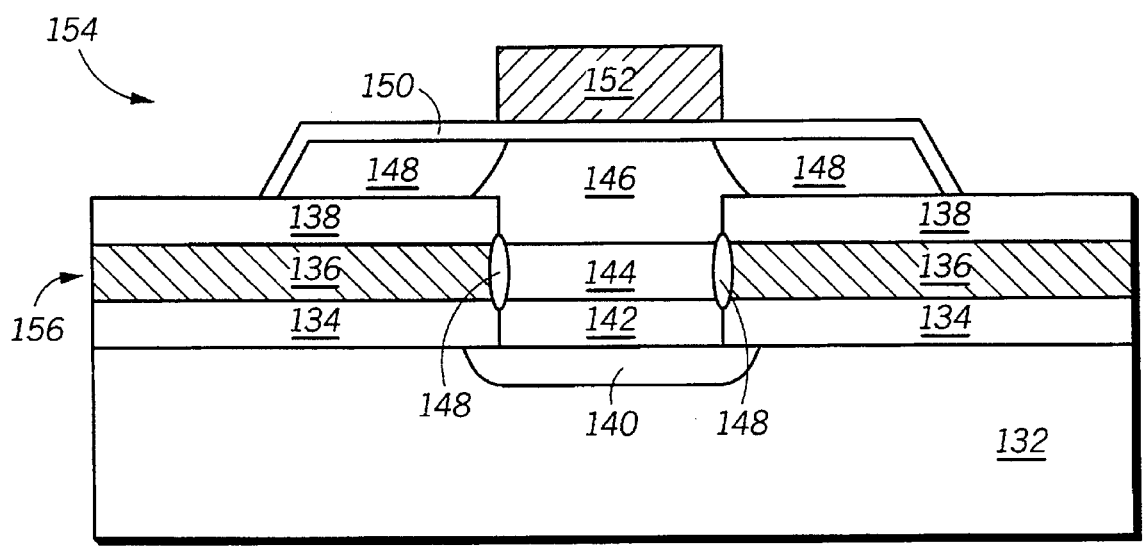

In FIGS. 33–34, another method for forming a dynamic SOI vertically raised transistor structure, analogous to the method for forming structure 15, is illustrated. In FIG. 33, a substrate 132 is illustrated having an optional diffusion 140. Dielectric layers 134 and 138 are illustrated. In FIG. 33, a vertical transistor having regions 142, 144, and 146, a gate sidewall dielectric 148, and a conductive layer 136 is formed as taught herein. Regions 142 and 146 function as current electrodes, region 144 is a channel region, and conductive layer 136 forms N conductive control electrodes or gate electrodes as taught herein. The regions 146 are epitaxially overgrown over the dielectric layer 138. The region 146 may be chemically/mechanically polished (CMP), etched-back, or planarized if necessary.

In FIG. 34, a gate oxide 150 is formed overlying the region 146. A gate electrode 152 is formed overlying the region 146. Source and drain regions 148 are implanted into the region 146 in a self-aligned manner. A structure similar to structure 15 is formed via the structure illustrated in FIG. 34.

Figure 35:
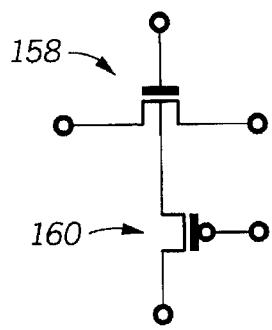
FIGS. 35–36 each illustrate, in schematic form, a schematic representation of the vertically raised transistors illustrated in FIG. 32 and FIG. 34.

FIG. 35 illustrates in a schematic diagram a five terminal device which may result from the structures illustrated in FIGS. 32 and 34. An N-channel raised vertical transistor 158 is formed over a vertical P-channel transistor 160.

Figure 36:
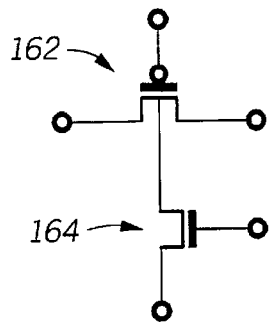

FIG. 36 illustrates in a schematic diagram another five terminal device which may result from the structures illustrated in FIGS. 32 and 34. A P-channel raised vertical transistor 162 is formed over a vertical N-channel transistor 164.

Known silicide techniques may be used to electrically short circuit PN junctions to form a five terminal device wherein both the transistors of FIG. 36 are one of either N-channel or P-channel devices.

Figure 37:
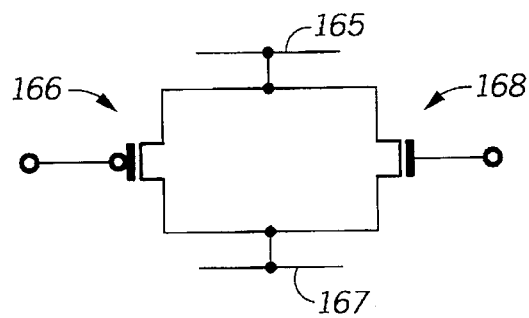
FIG. 37 illustrates, in schematic form, a raised vertical transistor structure in accordance with the present invention.

FIG. 37 illustrates that two vertical transistors 166 and 168 having opposite conductivity types may be used to connect a region 167 to a region 165. Region 167 is a substrate and region 165 is a vertically raised transistor in one form. In another form, region 165 may be a conductive layer and region 167 may be a conductive layer or a diffusion. In this form, the device of FIG. 37 functions as a programmable via or a contact which can be turned on and off via the vertical transistors 166 and 168. Due to the fact that transistor 166 is a P-channel transistor and that transistor 168 is an N-channel transistor, no voltage loss occurs through the via regardless of the voltage potentials carried by regions 165 and 167.

Figure 38:
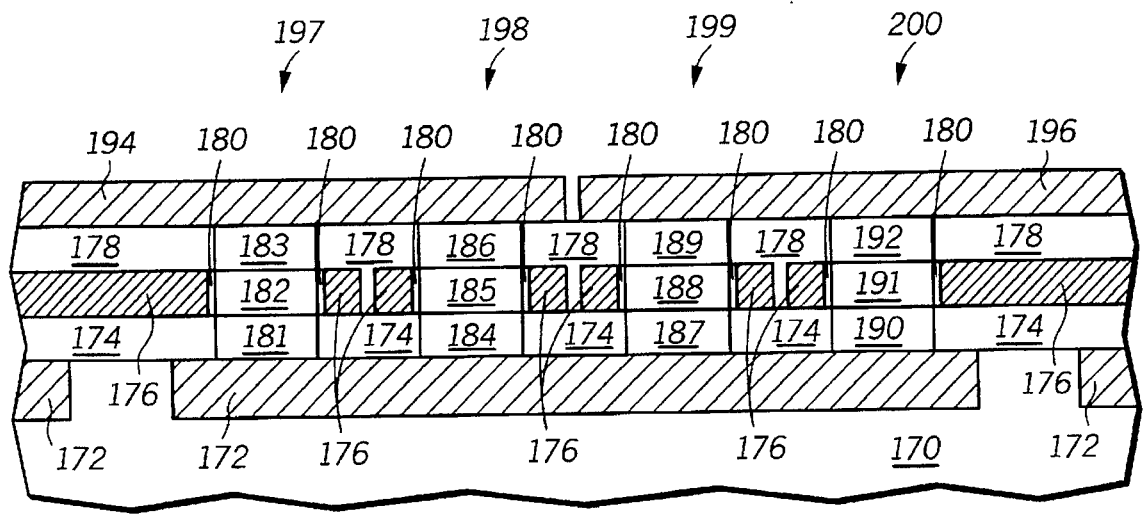
FIG. 38 illustrates, in cross-sectional form, a plurality of vertical transistor structures in accordance with the present invention.

FIG. 38 illustrates a cross-section of a structure which is analogous to the circuit of FIG. 37. Four vertical transistors 197, 198, 199, and 200 are illustrated in FIG. 38. Dielectric layers 174 and 178 are used for isolation purposes.

Vertical transistor 197 has a gate or control electrode defined by a conductive layer 176, a first current electrode 181, a second current electrode 183, a channel region 182, and a sidewall gate dielectric layer 180. The second current electrode 183 is electrically connected to a conductive layer 194. First current electrode 181 is electrically connected to a conductive layer 172. Vertical transistor 198 has a gate electrode defined by conductive layer 176, a first current electrode 184, a second current electrode 186, a channel region 185, and a sidewall gate dielectric layer 180. The second current electrode 186 is electrically connected to the conductive layer 194. First current electrode 184 is electrically connected to the conductive layer 172. Transistors 197 and 198 are of opposite conductivity types (i.e. one is P-channel and one is N-channel).

Vertical transistor 199 has a gate electrode defined by conductive layer 176, a first current electrode 187, a second current electrode 189, a channel region 188, and a sidewall gate dielectric layer 180. The second current electrode 188 is electrically connected to a conductive layer 196. First current electrode 187 is electrically connected to the conductive layer 172. Vertical transistor 200 has a gate electode defined by conductive layer 176, a first current electrode 190, a second current electrode 192, a channel region 191, and a sidewall gate dielectric layer 180. The second current electrode 192 is electrically connected to the conductive layer 196. First current electrode 190 is electrically connected to the conductive layer 172. Transistors 199 and 200 are of opposite conductivity types (i.e. one is P-channel and one is N-channel).

The method for forming the vertical transistors illustrated in FIG. 38 is taught herein in FIGS. 27–32. Conventional masking techniques will allow a P-channel and an N-channel transistor to be formed sequentially.

Conductive layer 194 and conductive layer 196 may each be a polysilicon layer, a metallic layer, a thin film transistor (TFT), a vertically raised transistor as illustrated herein, or a like semiconductor device. Conductive layer 172 may be a diffusion region, a polysilicon layer, a metallic layer, or a like conductive layer. A base layer 170 is one of either a dielectric layer or a substrate.

If conductive layers 194, 196 and 172 are diffusions, polysilicon, or a metallic layer, then the structure illustrated in FIG. 38 is a programmable contact or programmable via. For example, if transistors 197 and 198 are turned "off" and transistors 199 and 200 are turned "off", conductive layer 194 is disconnected from conductive layer 172 and conductive layer 196 is disconnected from conductive layer 172. If transistors 197 and 198 are turned "on" and transistors 199 and 200 are turned "off", conductive layer 194 is connected to conductive layer 172 and conductive layer 196 is disconnected from conductive layer 172. If transistors 197 and 198 are turned "off" and transistors 199 and 200 are turned "on", conductive layer 194 is disconnected from conductive layer 172 and conductive layer 196 is connected to conductive layer 172. If transistors 197 and 198 are turned "on" and transistors 199 and 200 are turned "on", conductive layer 194, 196 and 172 are all interconnected electrically.

This dynamic routing flexibility allows for one integrated circuit to be electrically re-wired dynamically to perform several functions. This flexibility is especially useful for application specific integrated circuits (ASICs), programmable logic arrays (PLAs), other programmable circuits, and multi-functional embedded controllers. In general, an integrated circuit can be re-wired dynamically from ROM, EPROM, DRAM, or SRAM or user input to alter the integrated circuit functionality or to provide special test features or other operations. The uses of a programmable via or contact are numerous.

Figure 39:
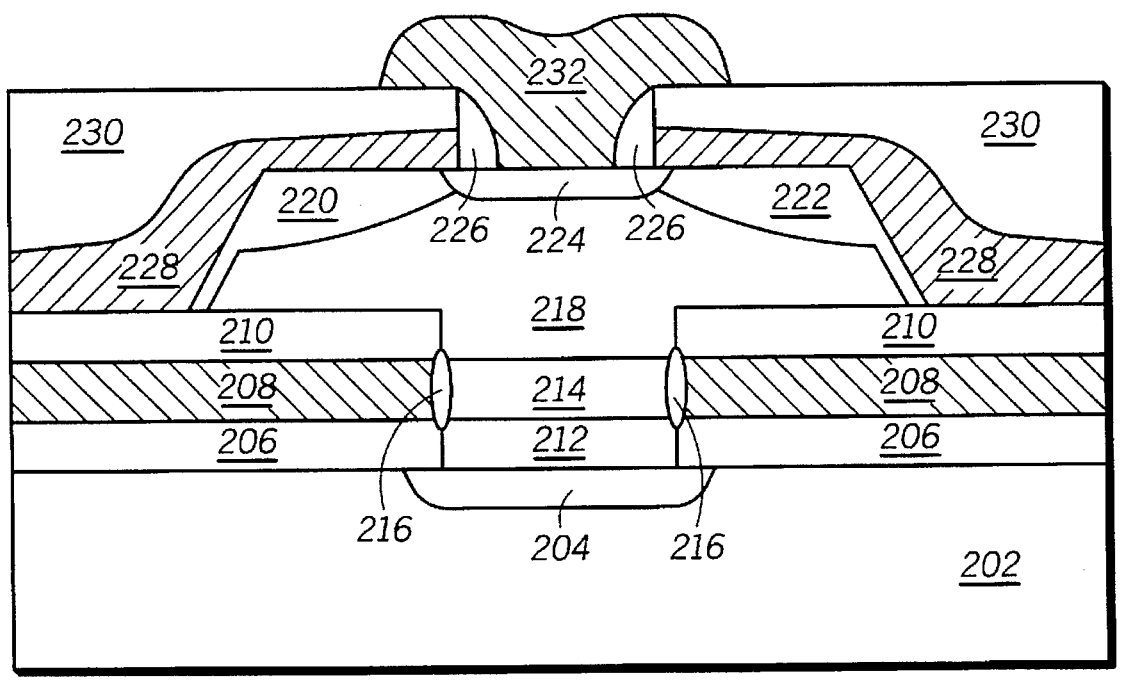
FIG. 39 illustrates, in cross-sectional form, a vertically raised bipolar transistor in accordance with the present invention.

FIG. 39 illustrates a structure wherein a dynamic substrate contact is used to contact a base of a bipolar transistor to a substrate. Illustrated in FIG. 39 is a substrate 202, an optional diffusion 204, a vertical transistor having a gate electrode 208, a gate dielectric 216, a first current electrode 212, a second current electrode 218, and a channel region 214. Dielectric layers 206 and 210 are used for isolation purposes. A conductive layer 228 is formed overlying current electrode 218. A dielectric layer 230 is formed for isolation. An opening (illustrated but not labeled) is formed through conductive layer 228 and dielectric layer 230 to separate conductive layer 228 into two electrically isolated regions. A spacer 226 is formed within the opening. A conductive layer 232 is formed within the opening and adjacent the spacer 226. Either implantation techniques and/or thermal driving of dopant atoms from conductive layer 228 is used to form diffused region 220, 224, and 222. Diffused region 220 functions as an emitter electrode, diffused region 222 functions as a collector electrode, and diffused region 224 functions as a base electrode.

The vertical transistor of FIG. 39 allows the base electrode to be electrically biased to alter bipolar transistor performance. The operation is similar to the operation of other structures discussed herein.

Figure 40:
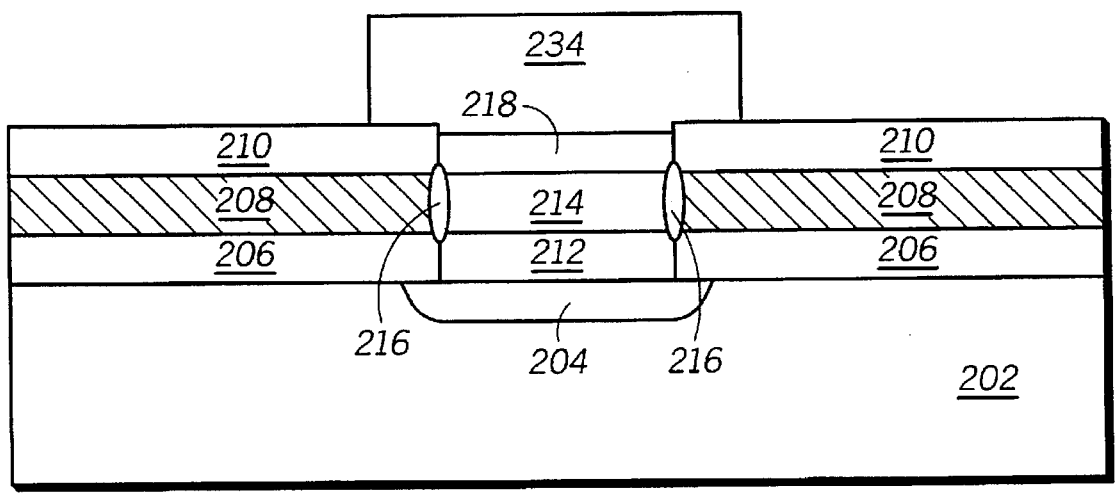
FIG. 40 illustrates, in cross-sectional form, another form of the vertically raised transistor in accordance with the present invention.

FIG. 40 is used to illustrate that a dynamic substrate contact similar to the substrate contact illustrated in FIG. 39 may be used for any semiconductor device 234. Elements in FIG. 40 which are analogous to elements in FIG. 39 are identically labeled. Device 234 may be a conventional diode, a device used for making displays, a capacitive coupling device (CCD), a junction field effect transistors (JFET), a TFT, a resistor, or a like semiconductor device or plurality of devices.

While the present invention has been illustrated and described with reference to specific embodiments, further modifications and improvements will occur to those skilled in the art. For example, FIG. 33 illustrates a region 146. This region 146 may be used to form a plurality of planar devices. For example, a NAND, NOR, memory cell, circuit, or inverter may be formed within the region 146. Isolation for the devices and structures taught herein may be enhanced by using diffusions, doped wells, changes in doping, changes in substrate conductivity, and the like. Other vertical and planar MOSFETs exist in the prior art. Any of these MOSFETs may be used in conjunction with the structures taught herein. The structure taught herein may be used to form Bipolar/CMOS (BiCMOS) devices and is adaptable to vertical integration and vertical devices. It is to be understood, therefore, that this invention is not limited to the particular forms illustrated and that it is intended in the appended claims to cover all modifications that do not depart from the spirit and scope of this invention.

We claim:

1. A vertically raised transistor comprising:

a substrate having a surface;

a first dielectric layer overlying the substrate;

a doped layer overlying the first dielectric layer, the doped layer being doped with dopant atoms;

a second dielectric layer overlying the doped layer;

an opening formed through a portion of the first dielectric layer, a portion of the doped layer, and a portion of the second dielectric layer which exposes the surface of the substrate and forms a sidewall of the doped layer;

a conductive plug region formed within the opening, the conductive plug region being laterally adjacent the doped layer and electrically coupled to the doped layer by a sidewall connection;

a first current electrode and a second current electrode formed in the conductive plug region and in electrical contact with a portion of the doped layer, the first and second current electrodes being physically separated by a channel region; and a control electrode overlying the channel region.

2. The vertically raised transistor of claim 1 further comprising:

a spacer formed within the opening, formed adjacent to the second dielectric layer, and formed underlying the control electrode.

3. The vertically raised transistor of claim 1 further comprising:

lightly doped first and second current electrodes formed within the conductive plug region.

4. The vertically raised transistor of claim 1 further comprising:

forming a second vertically raised transistor laterally adjacent the vertically raised transistor of claim 1 wherein the vertically raised transistor is now referred to as a first vertically raised transistor, the second vertically raised transistor being formed in accordance with claim 1 and being a P-channel MOSFET device while the first vertically raised transistor which is formed in accordance with claim 1 is formed as an N-channel MOSFET device.

5. The vertically raised transistor of claim 1 further comprising:

one or more spacers within the opening and adjacent to the second dielectric layer wherein the one or more spacers are doped with dopant atoms and used to dope the conductive plug region.

6. The vertically raised transistor of claim 1 wherein the doped layer is formed as one of either a polysilicon layer, a doped oxide layer, or a composite material having both a polysilicon region and a doped oxide region.

7. The vertically raised transistor of claim 1 wherein the conductive plug region is a silicon-based material which is grown from the surface of the substrate.

8. The vertically raised transistor of claim 1 further comprising:

a sidewall dielectric formed adjacent a portion of the sidewall of the doped layer.

9. The vertically raised transistor of claim 1 further comprising:

a diffusion region formed within the substrate and underneath the conductive plug region.

10. The vertically raised transistor of claim 1 further comprising:

a gate dielectric layer overlying a top portion of the conductive plug region.

11. A semiconductor structure comprising:

a substrate having a surface, the substrate having a conductivity type;

a vertical transistor formed overlying the substrate and having a first current electrode, a second current electrode which overlies the first current electrode, a channel region which separates the first current electrode from the second current electrode, and a gate electrode which is adjacent the channel region, the vertical transistor being characterized as having current flow substantially perpendicular to the surface of the substrate, the first and second current electrodes of the vertical transistor having a conductivity type different from the conductivity type of the substrate; and a lateral transistor overlying the vertical transistor wherein a portion of the vertically raised lateral transistor is electrically coupled to the second current electrode of the vertical transistor, the lateral transistor being characterized as having current flow which is substantially parallel to the surface of the substrate, the lateral transistor having a channel region which overlies the channel region of the vertical transistor.

12. The semiconductor structure of claim 11 wherein the vertical transistor comprises:

a first dielectric layer overlying the substrate;

a gate electrode conductive layer overlying the first dielectric layer;

a second dielectric layer overlying the gate electrode conductive layer;

an opening formed through the first dielectric layer, the second dielectric layer, and the gate electrode conductive layer, the opening forming an exposed surface of the gate electrode conductive layer;

a gate dielectric layer formed laterally adjacent the exposed surface of the gate electrode conductive layer; and a conductive region formed within the opening, the conductive region having a first portion which functions as the first current electrode, the first portion being adjacent the first dielectric layer and overlying the substrate, the conductive region having a second portion functioning as a channel region, the second portion being adjacent the gate dielectric layer, and overlying the first current electrode, and the conductive region having a third portion functioning as a second current electrode, the third portion being adjacent the second dielectric layer and the channel region.

13. The semiconductor structure of claim 11 wherein the gate electrode of the vertical transistor is a sidewall of a polysilicon layer.

14. The semiconductor structure of claim 11 wherein the lateral transistor further comprises:

a first dielectric layer overlying the vertical transistor;

a doped layer overlying the first dielectric layer, the doped layer being doped with dopant atoms;

a second dielectric layer overlying the doped layer;

an opening formed through a portion of the first dielectric layer, a portion of the doped layer, and a portion of the second dielectric layer which exposes the surface of the substrate and forms a sidewall of the doped layer;

a conductive plug region formed within the opening, the conductive plug region being laterally connected to the doped layer in a lateral connection region;

a source region and a drain region formed by driving dopant atoms out of the doped layer into the conductive plug region through the lateral connection region, the source and drain regions being physically separated by a channel region; and a gate electrode overlying the channel region.

15. The semiconductor structure of claim 11 wherein the first and second current electrodes and channel region of the vertical transistor are grown silicon-based regions of material.

16. The semiconductor structure of claim 15 wherein the conductive region is epitaxially laterally overgrown to form a lateral epitaxial portion which is used to form a channel region, a drain region, and a source region for the lateral transistor.

17. The semiconductor structure of claim 11 wherein the lateral transistor is an MOS transistor having a channel region wherein the portion of the lateral transistor which is electrically coupled to the second current electrode of the vertical transistor is the channel region of the vertically raised lateral transistor.

18. The semiconductor structure of claim 11 wherein the lateral transistor is a bipolar transistor wherein the portion which is electrically coupled to the second current electrode of the vertical transistor is a base electrode region.

19. A semiconductor structure comprising:

a first conductive layer;

a vertical P-channel transistor having a first current electrode electrically coupled to the first conductive layer, a second current electrode which overlies the first current electrode, a channel region which separates the first current electrode from the second current electrode, and a control electrode which is adjacent the channel region;

a vertical N-channel transistor formed in close proximity to the vertical P-channel transistor, the vertical N-channel transistor having a first current electrode electrically coupled to the first conductive layer, a second current electrode which overlies the first current electrode, a channel region which separates the first current electrode from the second current electrode, and a control electrode which is adjacent the channel region; and a second conductive layer formed overlying the first conductive layer, the second conductive layer being electrically coupled to the second current electrode of the vertical P-channel transistor and being electrically coupled to the second current electrode of the vertical N-channel transistor.

20. The semiconductor structure of claim 19 wherein each of the vertical N-channel transistor and the vertical P-channel transistor has a source region, a drain region, and a channel region which are each a material which comprises silicon.

* * * * *